(12) United States Patent
Masuda et al.

(10) Patent No.: US 11,996,962 B2
(45) Date of Patent: May 28, 2024

(54) COMMUNICATION DEVICE AND COMMUNICATION SYSTEM

(71) Applicant: Rohm Co., Ltd., Kyoto (JP)

(72) Inventors: Shinya Masuda, Kyoto (JP); Satoshi Tanaka, Kyoto (JP); Toru Mukai, Kyoto (JP); Hiroki Yamakami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 111 days.

(21) Appl. No.: 17/768,979

(22) PCT Filed: Oct. 16, 2020

(86) PCT No.: PCT/JP2020/039043
§ 371 (c)(1),
(2) Date: Apr. 14, 2022

(87) PCT Pub. No.: WO2021/085169
PCT Pub. Date: May 6, 2021

(65) Prior Publication Data
US 2023/0035309 A1     Feb. 2, 2023

(30) Foreign Application Priority Data

Nov. 1, 2019 (JP) ................................. 2019199618
Nov. 25, 2019 (JP) ................................. 2019212157

(51) Int. Cl.
*H04L 25/49* (2006.01)
*H03K 7/08* (2006.01)
(Continued)

(52) U.S. Cl.
CPC ............... *H04L 25/49* (2013.01); *H03K 7/08* (2013.01); *H04B 14/026* (2013.01); *H04B 14/046* (2013.01); *H04L 25/03* (2013.01)

(58) Field of Classification Search
CPC .......... H04L 25/49; H04L 25/03; H03K 7/08; H04B 14/026; H04B 14/046
(Continued)

(56) References Cited

U.S. PATENT DOCUMENTS 9,705,697 B1 * 7/2017 Tomita ................. H04L 7/0037
2014/0355622 A1 * 12/2014 Kishigami ............ H04L 12/413
370/445
(Continued)

FOREIGN PATENT DOCUMENTS

JP     2006238331      *  9/2006
JP     2014236233         12/2014
(Continued)

OTHER PUBLICATIONS

International Search Report in International Appln. No. PCT/JP2020/039043, dated Dec. 22, 2020, 4 pages (with English Translation).

*Primary Examiner* — Leila Malek
(74) *Attorney, Agent, or Firm* — Fish & Richardson P.C.

(57) ABSTRACT

A communication system is configured to use a pulse width modulation signal as transmission code among a plurality of nodes connected to a communication line. A master node includes a transmission transistor connected to the communication line, a detector configured to detect a variation in current during the on-period of the transmission transistor, and a communication circuit configured to determine the off-timing of the transmission transistor based on the timing of occurrence of the variation in current (i.e., the on-timing of a second transmission transistor provided in a slave node). For example, the communication circuit can be configured to determine the off-timing of the transmission transistor such that the simultaneously-on period TB of the transmission transistor and the second transmission transistor fulfills TB=(2n−1)/2f, where f is the frequency of EMI noise.

18 Claims, 20 Drawing Sheets

(51) Int. Cl.
  *H04B 14/02*  (2006.01)
  *H04B 14/04*  (2006.01)
  *H04L 25/03*  (2006.01)

(58) Field of Classification Search
  USPC .......................................................... 375/262
  See application file for complete search history.

(56) References Cited

U.S. PATENT DOCUMENTS

| | | | |
|---|---|---|---|
| 2015/0055696 A1* | 2/2015 | Kashima | ................ H04B 3/542 |
| | | | 375/238 |
| 2015/0295738 A1 | 10/2015 | Mori et al. | |
| 2017/0264376 A1 | 9/2017 | Tomita et al. | |
| 2019/0097738 A1 | 3/2019 | Tomita et al. | |
| 2019/0327005 A1 | 10/2019 | Tomita et al. | |
| 2020/0092015 A1 | 3/2020 | Tomita et al. | |

FOREIGN PATENT DOCUMENTS

| | | |
|---|---|---|
| JP | 2015043512 | 3/2015 |
| JP | 2015204519 | 11/2015 |
| JP | 2017200103 | 11/2017 |
| JP | 2018007237 | 1/2018 |

\* cited by examiner

COMMUNICATION DEVICE AND COMMUNICATION SYSTEM

TECHNICAL FIELD

The invention described herein relates to communication devices and communication systems.

BACKGROUND ART

Today in the field of vehicle onboard communication there are in practical use communication systems (such as CXPI [clock extension peripheral interface] communication systems) that use a pulse width modulation signal as transmission code among a plurality of nodes (between a master and slaves) that are connected to a communication line.

Some examples of conventional technology related to what has just been mentioned are seen in Patent Documents 1 to 3 identified below.

CITATION LIST

Patent Literature

Patent Document 1: Japanese unexamined patent application publication No. 2018-7237
Patent Document 2: Japanese unexamined patent application publication No. 2015-43512
Patent Document 3: Japanese unexamined patent application publication No. 2014-236233

SUMMARY OF INVENTION

Technical Problem

Inconveniently, the above-mentioned conventional communication systems (and communication devices employed in them) leave room for further studies in terms of reducing the EMI (electromagnetic interference) noise occurring during communication, reducing the spaces for and costs of communication systems, and improving the stability of communication.

In view of the above-mentioned problems encountered by the present inventors, an object of the invention disclosed herein is to provide a communication device and a communication system that can achieve EMI noise reduction combined with space saving and cost reduction in the communication system, or that can achieve EMI noise reduction combined with improved communication stability.

Solution to Problem

According to one aspect of what is disclosed herein, a communication device is for use as a master node in a communication system configured to use a pulse width modulation signal as transmission code among a plurality of nodes that are connected to a communication line, the communication device comprising: The communication device includes: a transmission transistor configured to be connected to the communication line; a detector configured to detect a variation in current during the on-period of the transmission transistor; and a communication circuit configured to determine the off-timing of the transmission transistor based on the timing of occurrence of the variation in current. (A first configuration.)

In the communication device of the first configuration described above, the timing of occurrence of the variation in current may correspond to the on-timing of a second transmission transistor provided in the slave node. (A second configuration.)

In the communication device of the second configuration described above, the communication circuit may be configured to determine the off-timing of the transmission transistor such that the simultaneously-on period TB of the transmission transistor and the second transmission transistor fulfills $TB=(2n-1)/2f$, where f is the frequency of EMI noise. (A third configuration.)

In the communication device of any of the first to third configurations described above, the detector may be provided in the current path via the transmission transistor. (A fourth configuration.)

In the communication device of any of the first to fourth configurations described above, the detector may include: a current-voltage conversion element configured to convert a current signal into a voltage signal; and a comparator configured to compare the voltage signal with a predetermined threshold value. (A fifth configuration.)

The communication device of any of the first to fifth configurations described above may further include: a receiver connected to the communication line; and a waveform shaper configured to control a drive signal for the transmission transistor. (A sixth configuration.)

According to another aspect of what is disclosed herein, a communication system include a master node, a slave node, and a communication line, and uses a pulse width modulation signal as transmission code between the master node and the slave node, which are connected to the communication line. Here, the master node is the communication device of any of the first to sixth configurations described above. (A seventh configuration.)

In the communication system of the seventh configuration described above, the terminal resistor in the master node may have a lower resistance value than the terminal resistor in the slave node. (An eighth configuration.)

The communication system of the eighth configuration described above may be configured to comply with a CXPI protocol. (A ninth configuration.)

According to another aspect of what is disclosed herein, a vehicle includes the communication system of any of the seventh to ninth configurations described above. (A tenth configuration.)

According to another aspect of what is disclosed herein, a communication is for use as a slave node in a communication system configured to use a pulse width modulation signal as transmission code among a plurality of nodes that are connected to a communication line. The communication device includes: a transmission transistor connected to the communication line; a detector configured to monitor a pulse width when only the master node is keeping the pulse width modulation signal at the dominant level; and a waveform shaper configured to control a drive signal for the transmission transistor in accordance with the output of the detector. (An eleventh configuration.)

In the communication device of the eleventh configuration described above, the detector may be configured to compare the pulse width with a predetermined threshold value. (A twelfth configuration.)

In the communication device of the twelfth configuration described above, the waveform shaper may be configured such that, at the on-transition of the transmission transistor, if the pulse width detected prior to the on-transition is greater than the threshold value, the waveform shaper controls the drive signal so as to limit the bus current passing across the communication line and, if the pulse width is smaller than the threshold value, the waveform shaper controls the drive signal so as not to limit the bus current. (A thirteenth configuration.)

In the communication device of the thirteenth configuration described above, the waveform shaper may be configured such that, at the on-transition of the transmission transistor, when limiting the bus current, the waveform shaper turns the drive signal to the logic level corresponding to the on-period at a first slew rate and, when not limiting the bus current, the waveform shaper turns the drive signal to the logic level corresponding to the on-period at a second slew rate higher than the first slew rate. (A fourteenth configuration.)

In the communication device of any of the eleventh to fourteenth configurations described above, the waveform shaper may include: a first waveform shaper configured to turn the drive signal to the logic level corresponding to the on-period at the first slew rate; a second waveform shaper configured to turn the drive signal to the logic level corresponding to the on-period at the second slew rate; and a selector configured to enable one of the first and second waveform shapers in accordance with the output of the detector. (A fifteenth configuration.)

In the communication device of any of the eleventh to fourteenth configurations described above, the waveform shaper may include a current source configured to generate an on-current for turning the drive signal to the logic level corresponding to the on-period, and is configured to control the magnitude of the on-current in accordance with the output of the detector. (A sixteenth configuration.)

The communication device of any of the eleventh to sixteenth configurations described above may further include: a receiver and a terminal resistor that are connected to the communication line; and a communication circuit that is connected to the detector, to the waveform shaper, and to the receiver. (A seventeenth configuration.)

According to another aspect of what is disclosed herein, a communication system includes a master node, a slave node, and a communication line, and uses a pulse width modulation signal as transmission code between the master node and the slave node, which are connected to the communication line. Here, the slave node is the communication device of any of the eleventh to seventeenth configurations described above. (An eighteenth configuration.)

In the communication system of the eighteenth configuration described above, the terminal resistor in the master node may have a lower resistance value than the terminal resistor in the slave node. (A nineteenth configuration.)

The communication system of the eighteenth or nineteenth configuration described above may comply with a CXPI protocol. (A twentieth configuration.)

According to another aspect of what is disclosed herein, a vehicle includes the communication system of any of the eighteenth to twentieth configurations described above.

Advantageous Effects of Invention

According to the invention described herein, it is possible to provide a communication device and a communication system that can achieve EMI noise reduction combined with space saving and cost reduction in the communication system, or that can achieve EMI noise reduction combined with improved communication stability.

DESCRIPTION OF EMBODIMENTS

<Communication System (Overall Configuration)>

Figure 1:
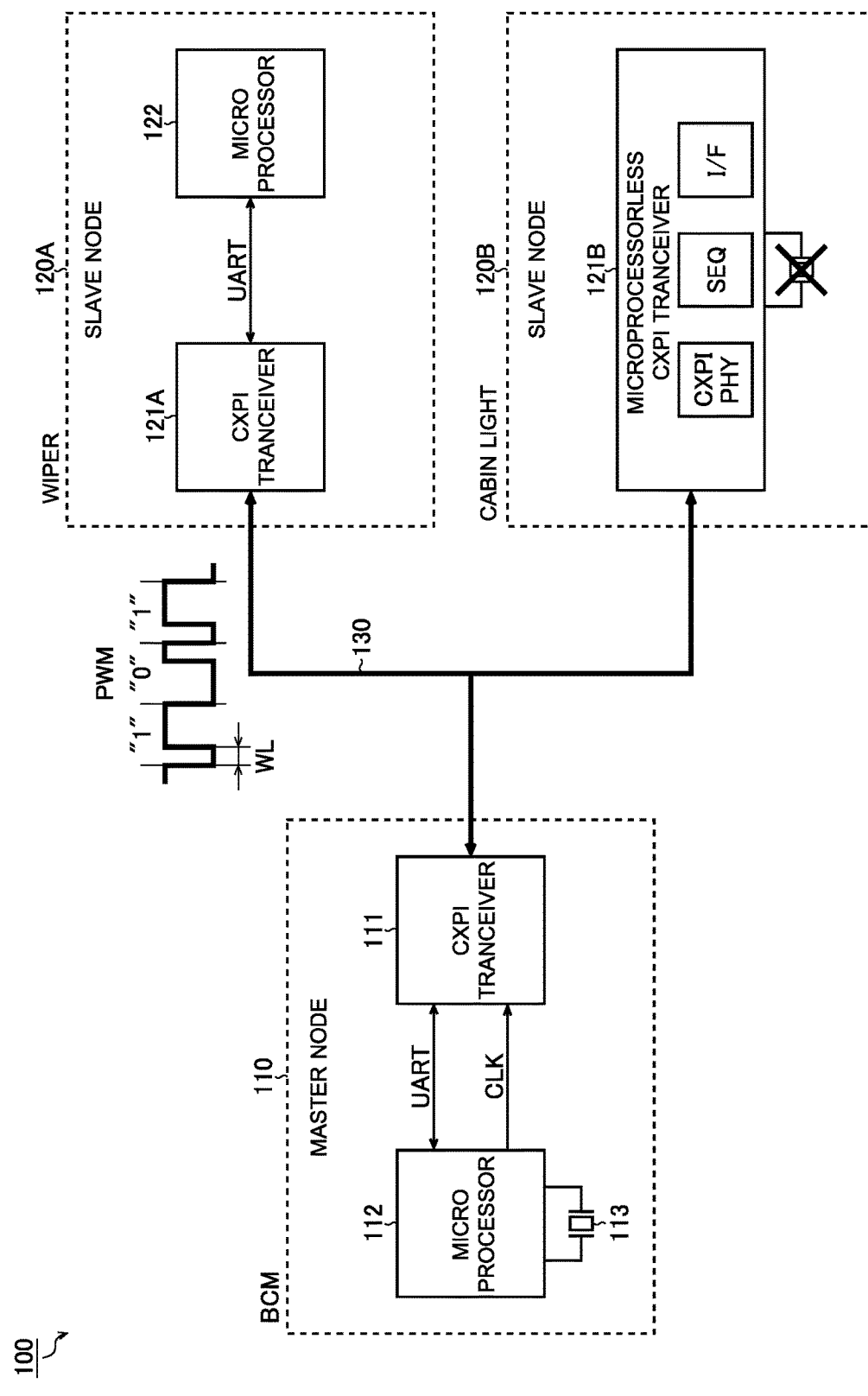
FIG. 1 is a diagram showing an overall configuration of a communication system.

FIG. 1 is a diagram showing the overall configuration of a communication system. The communication system 100 of this configuration example is designed to be mounted in a vehicle as a means for building a vehicle-mounted LAN (local area network). The communication system 100 includes a master node 110, slave nodes 120A and 120B, and a communication line 130. The communication system 100 complies with the CXPI protocol, and uses a pulse width modulation signal PWM as transmission code among a plurality of nodes connected to the communication line 130.

The master node 110 is, for example, a BCM (body control module) (or an ECU [electronic control unit] incorporated in it) for comprehensively controlling wipers, cabin lights, and the like. The master node 110 includes a CXPI transceiver 111, a microprocessor 112, and an oscillator 113.

The slave node 120A is, for example, a wiper (or an ECU incorporated in it), and includes a CXPI transceiver 121A and a microprocessor 122.

The slave node 120B is, for example, a cabin light (or an ECU incorporated in it), and includes a microprocessorless CXPI transceiver 121B. The microprocessorless CXPI transceiver 121B includes, for example, a CXPI physical layer, a sequencer, and an interface (such as a driver).

The communication line 130 is what is called a harness (wire harness), and is laid across different parts of a vehicle.

The slave nodes connected to the communication line 130 can be, other than wipers and cabin lights mentioned above, various vehicle-mounted devices such as an air conditioner and side mirrors.

The features of the CXPI protocol will be described in brief. First, the microprocessors 112 and 122 can each communicate by using a UART (universal asynchronous receiver/transmitter) interface. Second, between the CXPI transceiver 111 and the CXPI transceiver 121A or 121B, bidirectional communication is performed by use of a pulse width modulation signal PWM having data superposed on a communication clock CLK. Third, in the slave nodes 120A and 120B, the communication clock CLK can be extracted from the pulse width modulation signal PWM, and this eliminates the need to provide them with oscillators individually. Fourth, in the communication system 100, bidirectional communication can be performed among a plurality of nodes synchronously with the communication clock CLK generated by the oscillator 113 in the master node 110.

Next, bidirectional communication using the pulse width modulation signal PWM will be described in brief. The logical value of the data superposed in the pulse width modulation signal PWM is determined in accordance with the length of the period (i.e., pulse width WL) for which the pulse width modulation signal PWM stays at low level (the dominant level).

Specifically, if the pulse width WL is shorter than a predetermined logic determination value, the data is judged to have the logic value "1"; by contrast, if the pulse width WL is longer than the logic determination value, the data is judged to have the logic value "0".

For example, when the master node 110 transmits data "1", the CXPI transceiver 111 sets the low-level period (i.e., pulse width WL) of the pulse width modulation signal PWM shorter than the logic determination value; by contrast, when the master node 110 transmits data "0", the CXPI transceiver 111 sets the low-level period (i.e., pulse width WL) of the pulse width modulation signal PWM longer than the logic determination value.

Here, during the data transmission period of the slave node 120A or 120B (i.e., the data reception period of the master node 110), the master node 110 keeps constantly transmitting data "1", that is, it keeps constantly transmitting the communication clock CLK for synchronization to the slave nodes 120A and 120B.

Meanwhile, in accordance with the data to be transmitted from the slave node 120A or 120B, the CXPI transceiver 121A or 121B decides whether to extend the low-level period (i.e., pulse width WL) of the pulse width modulation signal PWM.

Specifically, when the slave node 120A or 120B transmits data "0", the low-level period of the pulse width modulation signal PWM is extended, so that the pulse width WL becomes longer than the logic determination value; by contrast, when the slave node 120A or 120B transmits data "1", the low-level period of the pulse width modulation signal PWM is not extended, so that the pulse width WL remains shorter than the logic determination value.

Complying with the CXPI protocol, the communication system 100 is configured such that the low level (dominant level) of the pulse width modulation signal PWM is dominant over the high level (recessive level). Accordingly, if collision occurs between the data transmitted from each of the slave nodes 120A and 120B, it is arbitrated such that the node transmitting low level (dominant level) longer prevails.

Incidentally, in the communication system 100 described above, while the pulse width modulation signal PWM is being transmitted and received between the master node 110 and the slave node 120A or 120B, EMI noise is emitted from the communication line 130. Thus, depending on the frequency band of the EMI noise, a nearby IC or system may malfunction or cease to operate. To prevent that, the communication system 100 is required to pass various emission tests.

<Emission Test System>

Figure 2:
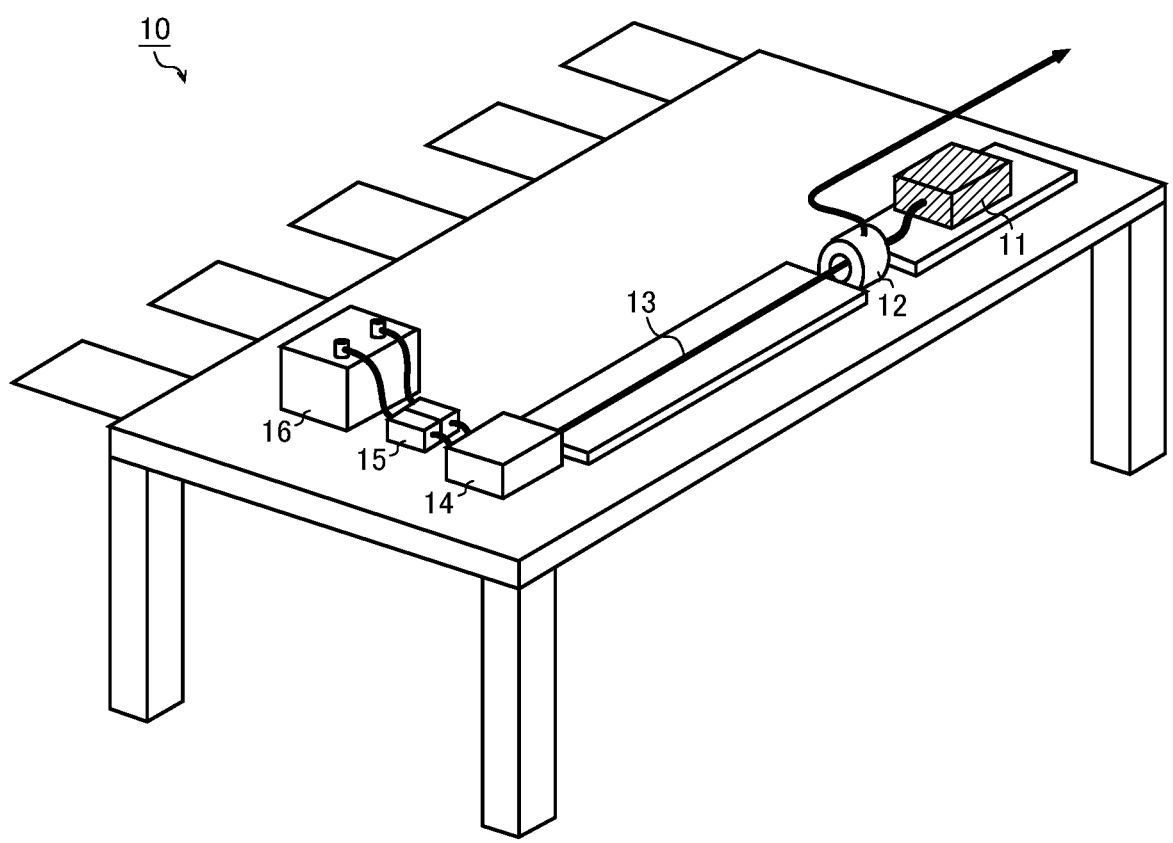
FIG. 2 is a diagram showing one example of an emission test system.

FIG. 2 is a diagram showing one configuration example of an emission test system. The emission test system 10 of this configuration example includes an EUT (equipment under test) 11, a current probe 12, a harness 13, a load 14, a LISN (line impedance stabilization network) 15, and a power supply 16. The emission test system 10 evaluates the conducted emission characteristics of the EUT 11 by a test method (current probe method) complying with the CISPR25 standard.

Specifically, with the emission test system 10 of this configuration example, the bus current (i.e., noise current) that passes across the harness 13 of the EUT 11 is measured with the current probe 12, and the measured value is evaluated to see whether it meets the prescribed limit value.

<Bus Current Path>

Figure 3:
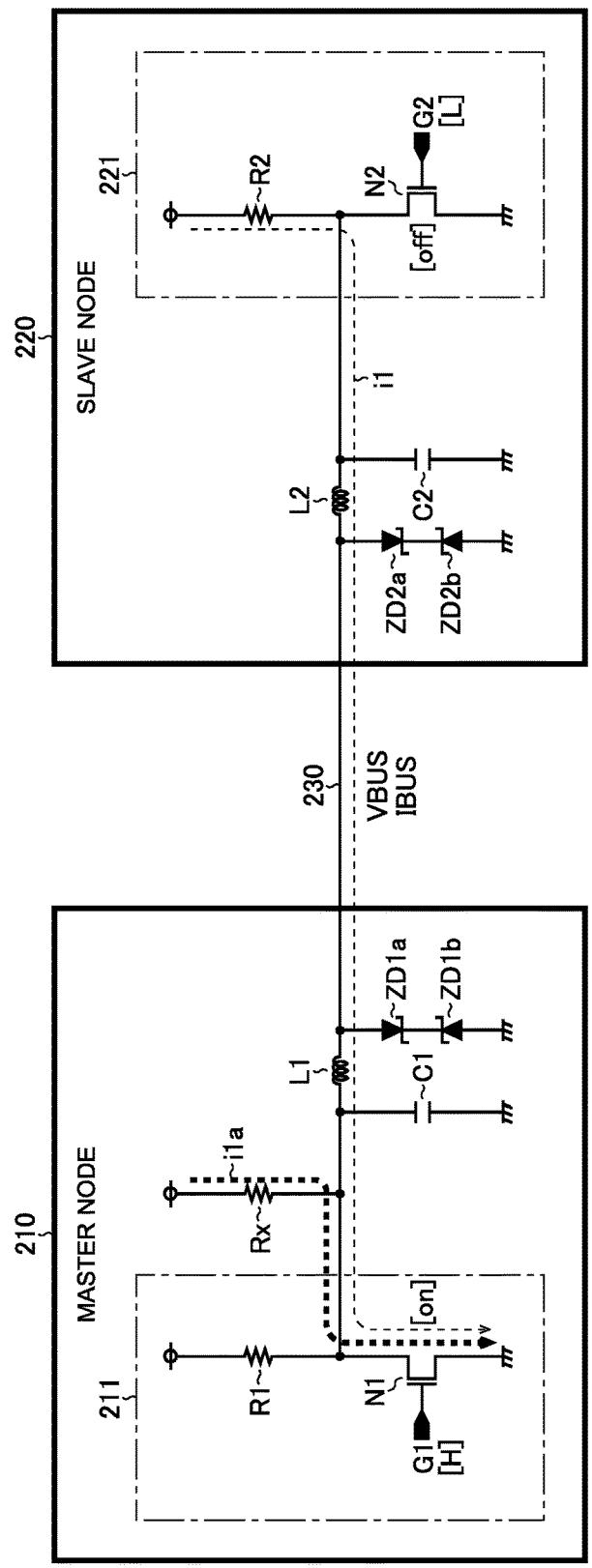
FIG. 3 is a diagram showing a first path (master on, slave off) of a buss current.
Figure 4:
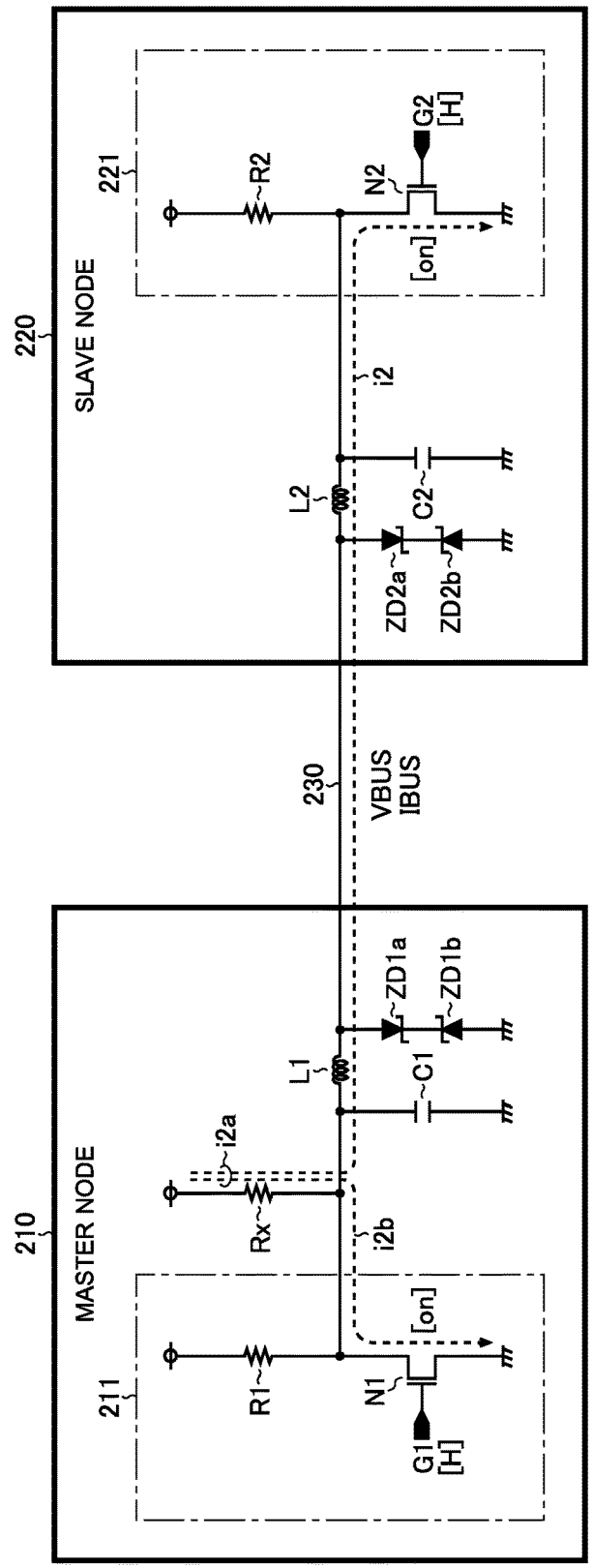
FIG. 4 is a diagram showing a second path (master on, slave on) of a buss current.
Figure 5:
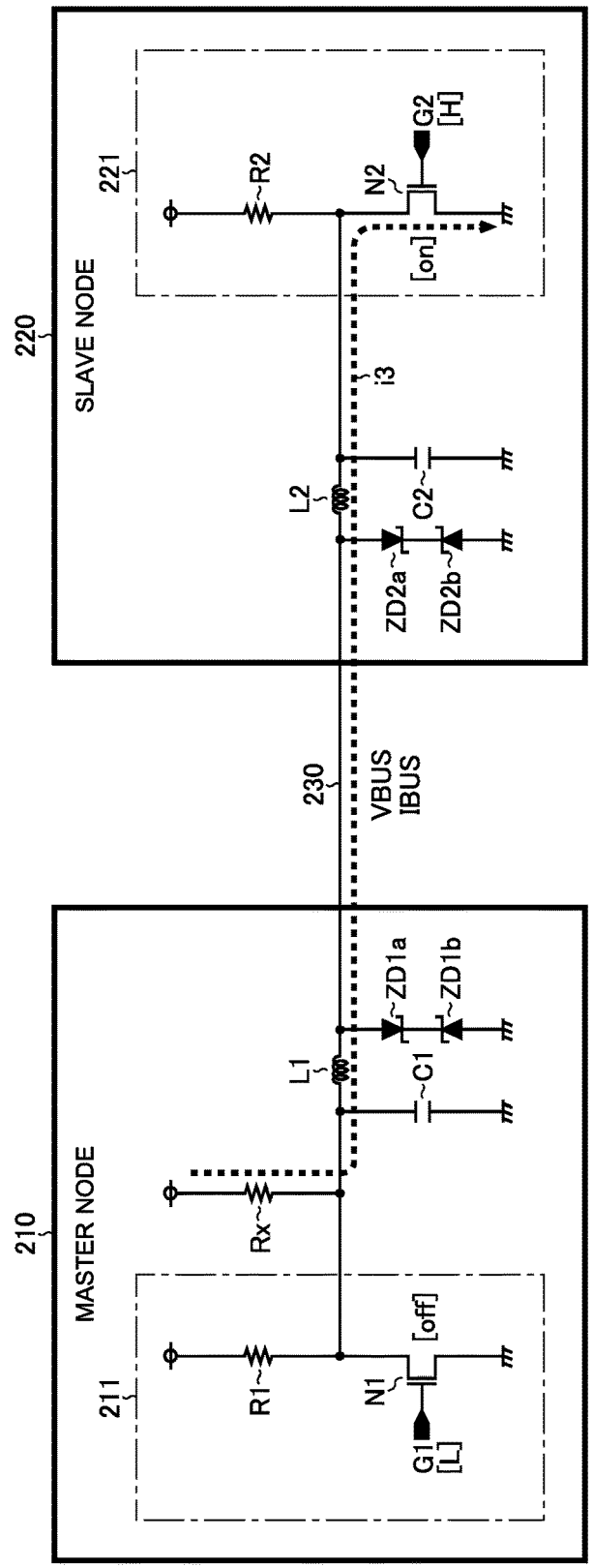
FIG. 5 is a diagram showing a third path (master off, slave on) of a buss current.

FIGS. 3 to 5 are diagrams showing a first path (master on, slave off), a second path (master on, slave on), and a third path (master off, slave on), respectively, of the bus current IBUS that is measured by the current probe method mentioned above.

First, the communication system 200 shown in the diagrams will be described. Like the communication system 100 (FIG. 1) described previously, the communication system 200 of this configuration example complies with the CXPI protocol, and includes a master node 210, a slave node 220, and a communication line 230.

The master node 210 (or an ECU incorporated in it) includes a transmission transistor N1 (in the illustrated example, an NMOSFET [N-channel metal-oxide-semiconductor field-effect transistor]), terminal resistors R1 and Rx, a capacitor C1, an inductor L1, and Zener diodes ZD1a and ZD1b.

The respective first terminals of the terminal resistors R1 and Rx are both connected to a supply power terminal. The respective second terminals of the terminal resistors R1 and Rx and the respective first terminals of the inductor L1 and the capacitor C1 are all connected to the drain of the transmission transistor N1. The source of the transmission transistor N1 and the second terminal of the capacitor C1 are both connected to a ground terminal. The gate of the transmission transistor N1 is connected to an application terminal for a drive signal G1. The second terminal of the inductor L1 and the anode of the Zener diode ZD1a are both connected to the communication line 230. The cathode of the Zener diode ZD1a is connected to the cathode of the Zener diode ZD1b. The anode of the Zener diode ZD1b is connected to the ground terminal.

On the other hand, the slave node 220 (or an ECU incorporated in it) includes a transmission transistor N2 (e.g., an NMOSFET), a terminal resistor R2, a capacitor C2, an inductor L2, and Zener diodes ZD2a and ZD2b.

The first terminal of the terminal resistor R2 is connected to the supply power terminal. The second terminal of the terminal resistor R2 and the respective first terminals of the inductor L2 and the capacitor C2 are all connected to the drain of the transmission transistor N2. The source of the transmission transistor N2 and the second terminal of the capacitor C2 are both connected to the ground terminal. The gate of the transmission transistor N2 is connected to an application terminal for a drive signal G2. The second terminal of the inductor L2 and the anode of the Zener diode ZD2a are both connected to the communication line 230. The cathode of the Zener diode ZD2a is connected to the cathode of the Zener diode ZD2b. The anode of the Zener diode ZD2b is connected to the ground terminal.

Of the components mentioned above, the transmission transistor N1 and the terminal resistor R1 (or the terminal resistor Rx) constitute an open-drain output stage of a CXPI transceiver 211. The transmission transistor N2 and the terminal resistor R2 constitute an open-drain output stage of a CXPI transceiver 221.

The transmission transistor N1 is on when the drive signal G1 is at high level, and is off when the drive signal G1 is at low level. The transmission transistor N2 is on when the drive signal G2 is at high level, and is off when the drive signal G2 is at low level.

Here, the terminal resistors R1 and R2 have a resistance of, for example, 30 kΩ. On the other hand, the terminal resistor Rx, which is provided only in the master node 210, has a resistance of 1 kΩ. Thus, in the communication system 200 of this configuration example, the terminal resistor (i.e., the composite resistance of the terminal resistors R1 and Rx) in the master node 210 has a lower resistance value than the terminal resistor R2 in the slave node 220.

Of the components mentioned above, the Zener diodes ZD1a and ZD2a each function as an output reverse connection protection element. On the other hand, the Zener diodes ZD1b and ZD2b each function as a surge voltage absorption element.

Of the components mentioned above, the transmission transistors N1 and N2 may be, instead of NMOSFETs as mentioned above, npn-type bipolar transistors or N-channel IGBTs (insulated-gate bipolar transistors).

First, with reference to FIG. 3, consider a condition where the transmission transistor N1 in the master node 210 is on and the transmission transistor N2 in the slave node 220 is off.

In this condition, the bus current IBUS passes across the communication line 230 in the direction from the slave node 220 to the master node 210 (see the broken-line arrow i1 in the diagram). This bus current IBUS passes via the terminal resistor R1 with a high resistance value (e.g., 30 kΩ) and thus has a minute current value. Meanwhile, the high current that passes through the terminal resistor Rx with a low resistance value (e.g., 1 kΩ) passes via the transmission transistor N1 in the master node 210 to the ground terminal and thus does not pass across the communication line 230 (see the broken-line arrow i1a in the diagram).

Next, with reference to FIG. 4, consider a condition where the transmission transistor N1 in the master node 210 and the transmission transistor N2 in the slave node 220 are both on.

In this condition, the bus current IBUS passes across the communication line 230 in the direction from the master node 210 to the slave node 220 (see the broken-line arrow i2 in the diagram). This bus current IBUS has a current value nearly equal to the current value (i2≈i2a−i2b, e.g., i2≈i2a/2) calculated by subtracting from the current (broken-line arrow i2a) that passes via the terminal resistor Rx with a lower resistance value (e.g., 1 kΩ) the current (broken-line arrow i2b) that passes via the transmission transistor N1 to the ground terminal.

Next, with reference to FIG. 5, consider a condition where the transmission transistor N1 in the master node 210 is off and the transmission transistor N2 in the slave node 220 is on.

In this condition, the bus current IBUS passes across the communication line 230 in the direction from the master node 210 to the slave node 220 (see the broken-line arrow i3 in the diagram). This bus current IBUS corresponds to almost the whole of the high current that passes via the terminal resistor Rx with a low resistance value (e.g., 1 kΩ). Thus, the bus current IBUS has a higher current value than when the transmission transistors N1 and N2 are both on (FIG. 4) (i.e., i3>i2).

As described above, in the communication system 200, the master node 210 and the slave node 220 have different terminal resistance values (master: 1 kΩ, slave: 30 kΩ). Thus, when the slave node 220 transmits data "0", that is to say, at the time point that, from the state where the transmission transistor N1 is on and the transmission transistor N2 is off, the transmission transistor N2 turns on, and also at the time point that, from the state where the transmission transistors N1 and N2 are both on, the transmission transistor N1 turns off, the bus current IBUS increases.

<EMI Noise>

Figure 6:
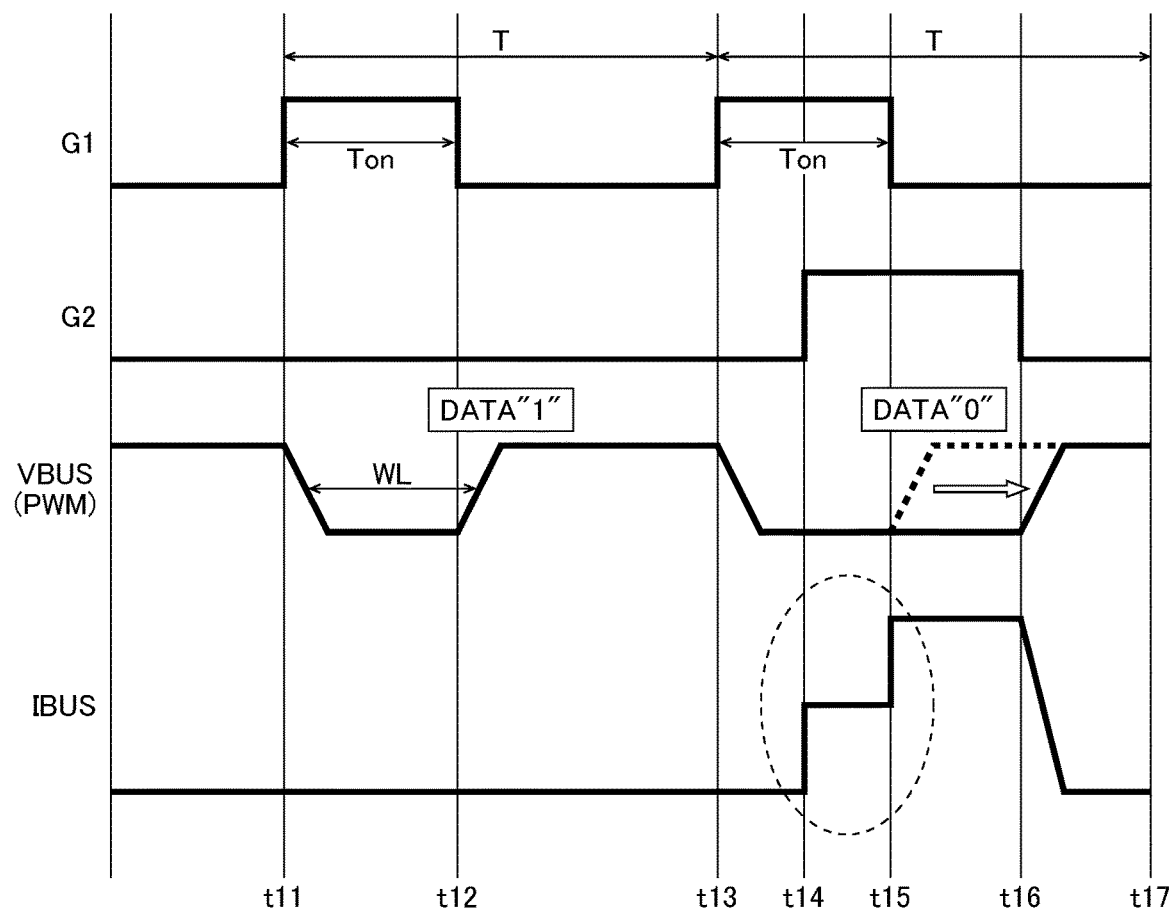
FIG. 6 is a diagram showing how an abrupt variation occurs in a buss current during transmission by a slave node.

FIG. 6 is a timing chart showing how an abrupt variation (hence EMI noise) occurs in the bus current IBUS during transmission by the slave node 220. FIG. 6 depicts, from the top down, the drive signals G1 and G2, the bus voltage VBUS (i.e., pulse width modulation signal PWM) appearing on the communication line 230, and the bus current IBUS.

During the data transmission period of the slave node 220, the master node 210 keeps constantly transmitting data "1", that is, it keeps pulse-driving the drive signal G1 with such an on-duty Don (=Ton/The, where T is the switching period and Ton is the on-period) that the pulse width WL (the length of the low-level period) of the pulse width modulation signal PWM remains lower than the logic determination value. In terms of what is shown in FIG. 6, the drive signal G1 is at high level between time points t11 and t12 and between time points t13 and t15, and is at low level between time points t15 and t17.

Here, in the cycle in which the slave node 220 transmits data "1" (i.e., between time points t11 and t13), the drive signal G2 is kept at low level and the transmission transistor N2 is kept off. As a result, the low-level period of the pulse width modulation signal PWM is not extended, and the pulse width WL remains shorter than the logic determination value.

Incidentally, between time points t11 and t12, the transmission transistor N1 in the master node 210 is on and the transmission transistor N2 in the slave node 220 is off. Accordingly, across the communication line 230 passes a minute bus current IBUS (≈0) in the direction from the slave node 220 to the master node 210 (see also FIG. 3 referred to previously).

By contrast, in the cycle in which the slave node 220 transmits data "0" (i.e., between time points t13 and t17), the drive signal G2 is raised to high level and the transmission transistor N2 is turned on. Specifically, in terms of what is shown in FIG. 6, after at the time point t13 the drive signal G1 is raised to high level, at time point t14 the drive signal G2 is raised to high level. Then, after at time point t15 the drive signal G1 is dropped to low level, at time point t16 the drive signal G2 is dropped to low level. Thus the low-level period of the pulse width modulation signal PWM is extended and the pulse width WL becomes longer than the logic determination value.

Incidentally, between time points t13 and t14, the transmission transistor N1 in the master node 210 is on and the transmission transistor N2 in the slave node 220 is off. Accordingly, across the communication line 230 passes a minute bus current IBUS (≈0) in the direction from the slave node 220 to the master node 210 (see also FIG. 3 referred to previously). This behavior is similar to that between the preceding time points t11 and t12.

By contrast, between time points t14 and t15, the transmission transistors N1 and N2 are both on. Accordingly, across the communication line 230 passes a bus current IBUS in the direction from the master node 210 to the slave node 220 (see also FIG. 4 referred to previously). Incidentally, even when at time point t14 the transmission transistor N2 is turned on, no potential change occurs in the bus voltage VBUS. Thus the bus current IBUS increases with a steep current slope, and this causes large EMI noise.

Between time points t15 and t16, the transmission transistor N1 is off and the transmission transistor N2 is off. Accordingly, across the communication line 230 passes a higher bus current IBUS in the direction from the master node 210 to the slave node 220 (see also FIG. 5 referred to previously). Incidentally, even when at time point 15 the transmission transistor N1 is turned off, no potential change occurs in the bus voltage VBUS. Thus the bus current IBUS increases with a steep current slope, and this causes large EMI noise.

When at time point t16 the transmission transistor N2 turns off, the bus voltage VBUS rises gently, and thus also the bus current IBUS decreases gently. Thus, at this time, EMI noise poses no significant problem.

As described above, an abrupt variation in the bus current IBUS during data transmission by the slave node 220 causes large EMI noise (see the broken-line frame in FIG. 6).

<Measure Against EMI>

Figure 7:
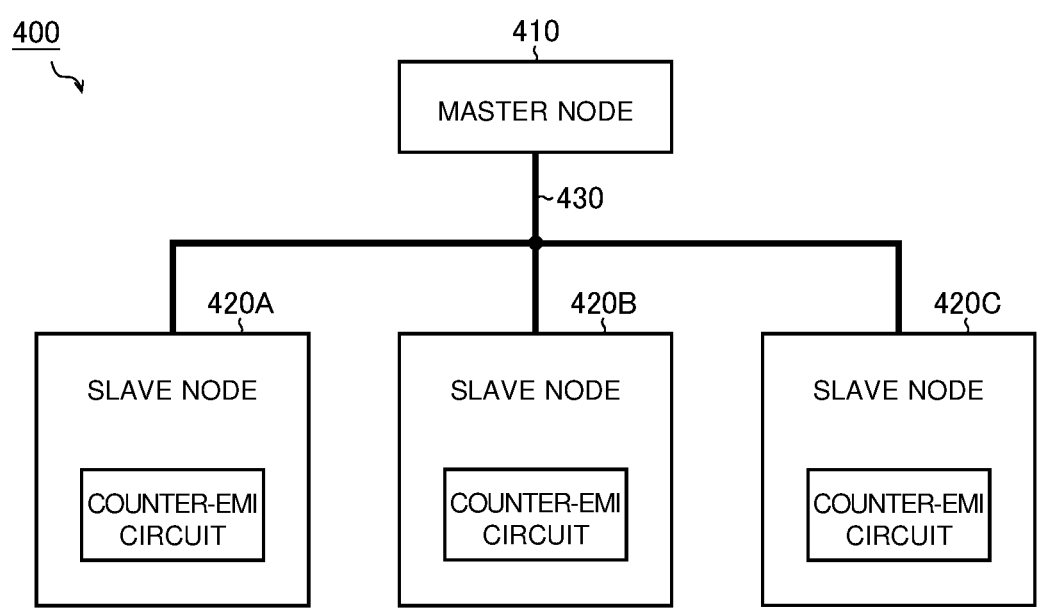
FIG. 7 is a diagram showing one example of a common measure against EIM.

FIG. 7 is a diagram showing one example of a common measure against EMI. Like the communication system 100 (FIG. 1) and the communication system 200 (FIGS. 3 to 5) described previously, the communication system 400 of this configuration example complies with the CXPI protocol, and includes a master node 410, slave nodes 420A to 420C, and a communication line 430.

It should be noted that in common measures against EMI (see, e.g., Patent Document 1), as seen in the communication system 400 shown in FIG. 7, a counter-EMI circuit is added not to the master node 410 but to each of the slave nodes 420A to 420C.

This inconveniently leads to an increase in the scale and cost of the communication system 400 because, from the perspective of the entire communication system 400, it includes a larger number of slave nodes 420A to 420C than it does a master node 410.

To follow is a presentation of a novel embodiment that provides a solution to the above-mentioned inconvenience.

<Communication System (First Embodiment)>

Figure 8:
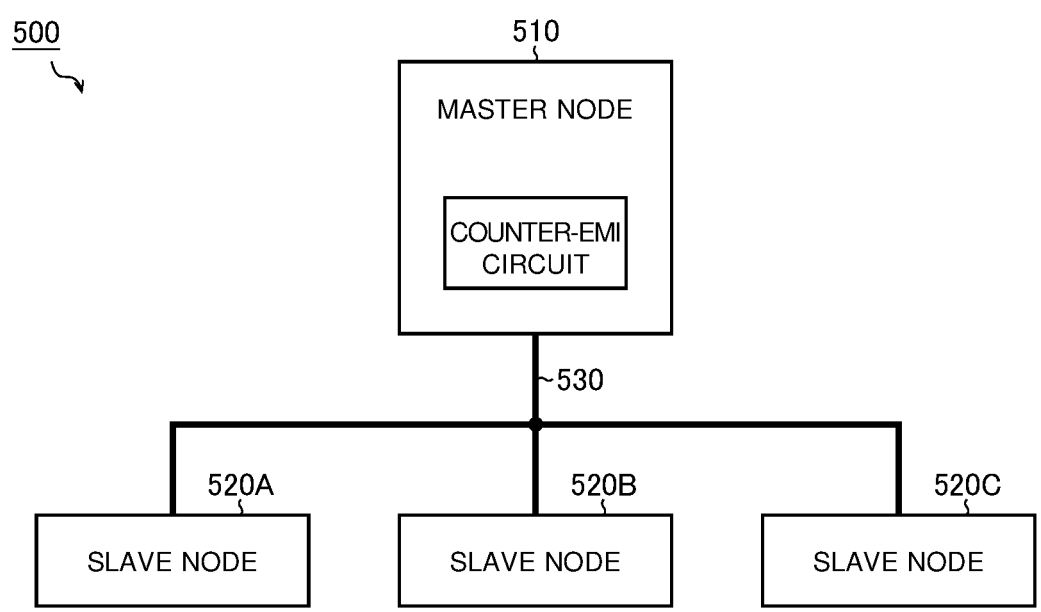
FIG. 8 is a diagram showing a communication system according to a first, novel, embodiment.

FIG. 8 is a diagram showing a communication system according to a first, novel, embodiment. Like the communication system 100 (FIG. 1), the communication system 200 (FIGS. 3 to 5), and the communication system 400 (FIG. 7) described previously, the communication system 500 of this configuration example complies with the CXPI protocol, and includes a master node 510, slave nodes 520A to 520C, and a communication line 530.

What is particular about the communication system 500 of this embodiment is that, unlike the communication system 400 (FIG. 7) described previously, a counter-EMI circuit is added to the master node 510, whereas none is added to any of the slave nodes 520A to 520C.

This achieves space saving and cost reduction in the communication system 500 from the perspective of the entire communication system 500.

Now, the configuration and operation of the master node 510 and those of the slave nodes 520A to 520C will be described in detail.

Figure 9:
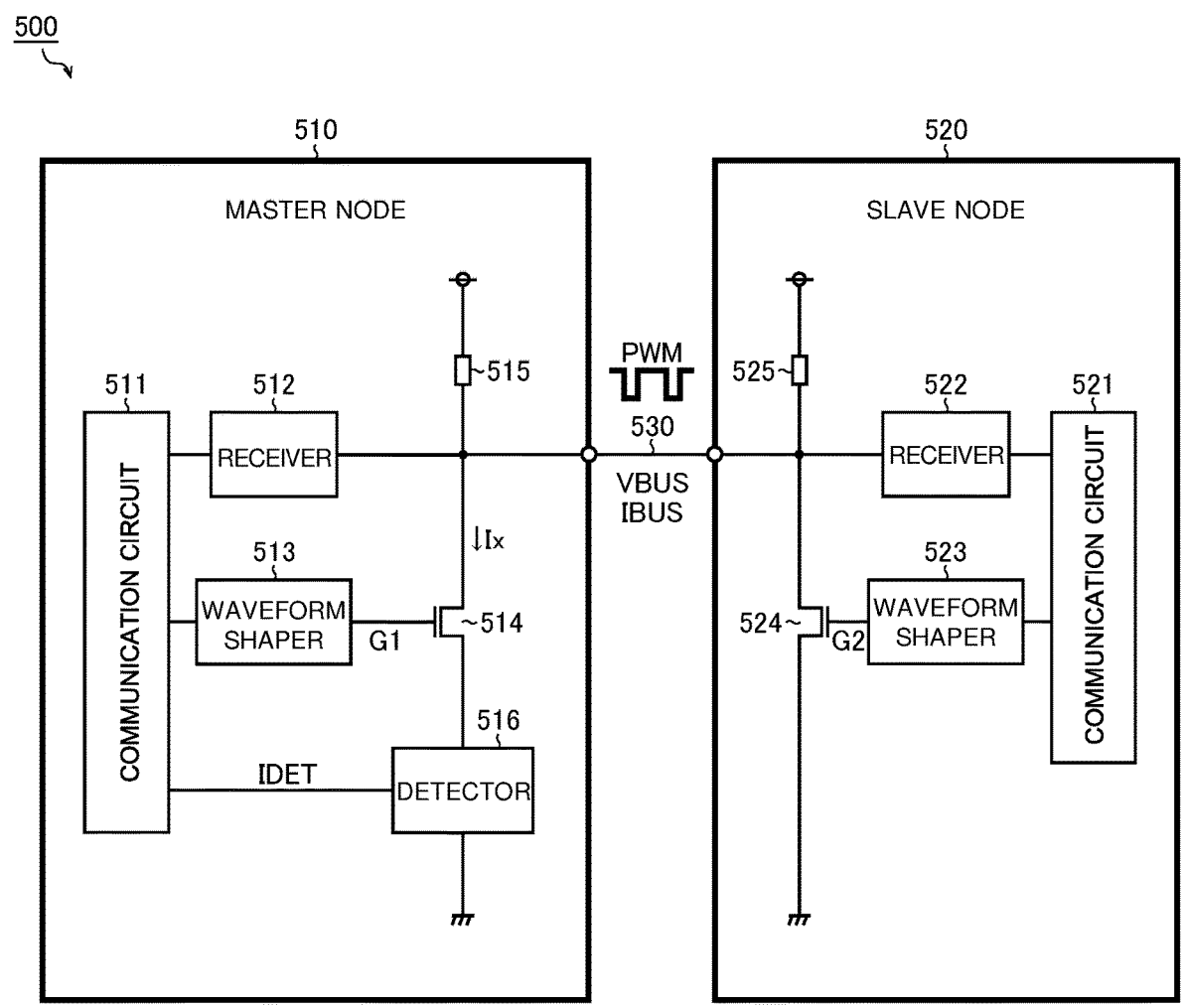
FIG. 9 is a diagram showing one configuration example of a master node and slave nodes.

FIG. 9 is a diagram showing one configuration example of the master node 510 and a slave node 520 (which can be understood as any of the slave nodes 520A to 520C mentioned above).

The master node 510 includes a communication circuit 511, a receiver 512, a waveform shaper 513, a transmission transistor 514 (e.g., NMOSFET), a terminal resistor 515, and a detector 516.

The communication circuit 511 is connected to both the receiver 512 and the waveform shaper 513, and controls communication in compliance with the CXPI protocol. Specifically, the communication circuit 511 accepts the output of the receiver 512 and thereby receives the data transmitted from the slave node 520. The communication circuit 511 also feeds the waveform shaper 513 with a signal having data superposed on a communication clock, and thereby transmits the data to the slave node 520.

The communication circuit 511 further has the function of determining the off-timing of the transmission transistor 514 based on an current detection signal IDET fed from the detector 516 (this will be described in detail later).

The receiver 512 is connected between the communication circuit 511 and the communication line 530. The receiver 512 detects the pulse width WL of the bus voltage VBUS (i.e., pulse width modulation signal PWM) appearing on the communication line 530, and feeds the detection result to the communication circuit 511. Suitably usable as the receiver 512 is, for example, a comparator that compares the bus voltage VBUS with a predetermined logic determination value.

The waveform shaper 513 is connected between the communication circuit 511 and the transmission transistor 514. The waveform shaper 513 performs wave-shaping on the signal fed from the communication circuit 511 and thereby generates the drive signal G1.

The drain of the transmission transistor 514 is connected to the communication line 530. The source of the transmission transistor 514 is connected via the detector 516 to the ground terminal. The gate of the transmission transistor 514 is connected to an application terminal for the drive signal G1 (i.e., the output terminal of the waveform shaper 513). The transmission transistor 514 is on when the drive signal G1 is at high level, and is off when the drive signal G1 is at low level.

The terminal resistor 515 is connected between the supply power terminal and the communication line 530, and together with the transmission transistor 514 constitutes the open-drain output stage of the master node 510.

The detector 516 is connected in the current path via the transmission transistor 514 (in FIG. 9, between the source of the transmission transistor 514 and the ground terminal). The detector 516 detects a variation in current (i.e., a drop in the sink current Ix passing through the transmission transistor 514) during the on-period Ton of the transmission transistor 514, and feeds the detection result as the current detection signal IDET to the communication circuit 511.

On the other hand, the slave node 520 includes a communication circuit 521, a receiver 522, a waveform shaper 523, a transmission transistor 524, and a terminal resistor 525.

The communication circuit 521 is connected to both the receiver 522 and the waveform shaper 523, and controls communication in compliance with the CXPI protocol. Specifically, the communication circuit 521 accepts the output of the receiver 522 and thereby receives the data transmitted from the master node 510. The communication circuit 521 also feeds the waveform shaper 523 with a signal having data superposed on the communication clock extracted from the output of the receiver 522, and thereby transmits the data to the master node 510.

The receiver 522 is connected between the communication circuit 521 and the communication line 530. The receiver 522 detects the pulse width WL of the bus voltage VBUS (i.e., pulse width modulation signal PWM) appearing on the communication line 530, and feeds the detection result to the communication circuit 521. Suitably usable as the receiver 522 is, for example, a comparator that compares the bus voltage VBUS with a predetermined logic determination value.

The waveform shaper 523 is connected between the communication circuit 521 and the transmission transistor 524. The waveform shaper 523 performs wave-shaping on the signal fed from the communication circuit 521 and thereby generates the drive signal G2.

The drain of the transmission transistor 524 is connected to the communication line 530. The source of the transmission transistor 524 is connected to the ground terminal. The gate of the transmission transistor 524 is connected to an application terminal for the drive signal G2 (i.e., the output terminal of the waveform shaper 523). The transmission transistor 524 is on when the drive signal G2 is at high level, and is off when the drive signal G2 is at low level.

The terminal resistor 525 is connected between the supply power terminal and the communication line 530, and together with the transmission transistor 524 constitutes the open-drain output stage of the master node 520.

The terminal resistor 515 in the master node 510 (which resistor corresponds to the composite resistance of the terminal resistors R1 and Rx in FIGS. 3 to 5) is given a lower resistance value than the terminal resistor 525 in the slave node 520 (which resistor corresponds to the terminal resistor R2 in FIGS. 3 to 5).

<Detector>

Figure 10:
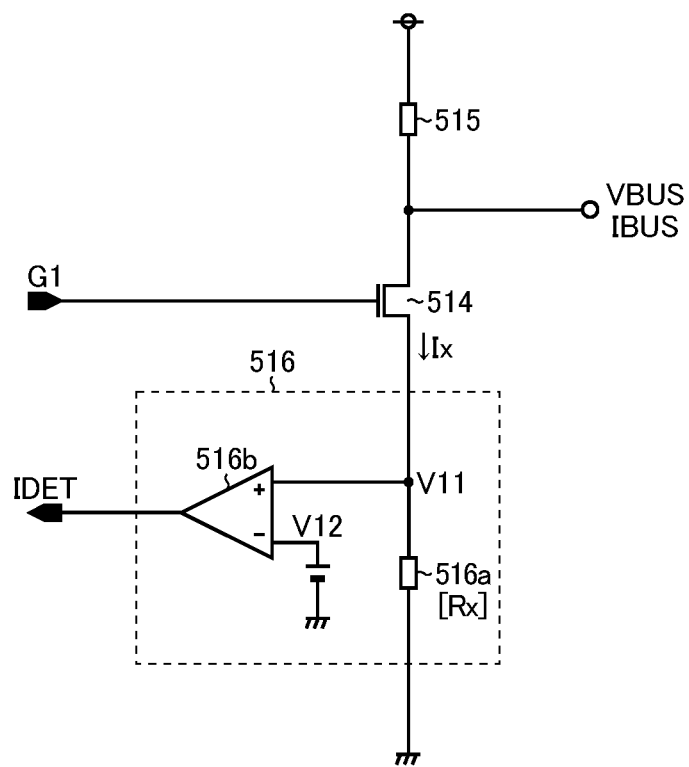
FIG. 10 is a diagram showing one configuration example of a detector.

FIG. 10 is a diagram showing one configuration example of the detector 516. The detector 516 of this configuration example includes a sense resistor 516a and a comparator 516b.

The sense resistor 516a (with a resistance value Rx) is connected between the source of the transmission transistor 514 and the ground terminal. The sense resistor 516a acts as a current-voltage conversion element that converts the sink current Ix passing during the on-period Ton of the transmission transistor 514 into a sense voltage V11 (=Ix×Rx).

The comparator 516b compares the sense voltage V11, which is fed to the non-inverting terminal (+) of the comparator 516b, with a predetermined threshold voltage V12, which is fed to the inverting input terminal (−) of the comparator 516b, and thereby generates the current detection signal IDET. The comparator 516b then feeds the current detection signal IDET to the communication circuit 511. The current detection signal IDET is at high level when V11>V12, and is at low level when V11<V12.

<Off-Timing Control>

Figure 11:
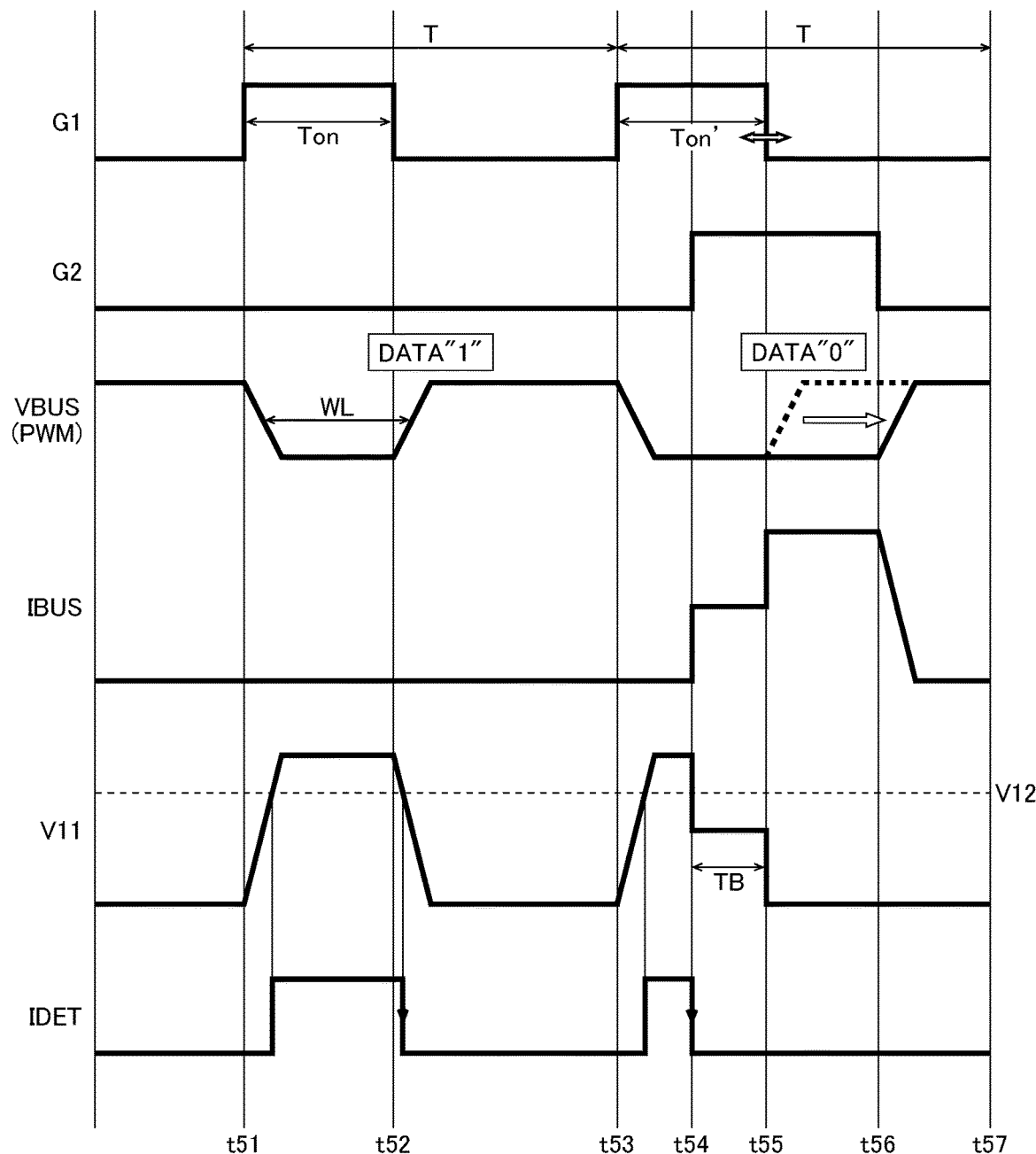
FIG. 11 is a diagram showing off-timing control operation in a master node.

FIG. 11 is a diagram showing off-timing control operation for the transmission transistor 514 in the master node 510, depicting, from the top down, the drive signals G1 and G2, the bus voltage VBUS (i.e., pulse width modulation signal PWM), the bus current IBUS, the sense voltage V11 (with the threshold voltage V12), and the current detection signal IDET.

During the data transmission period of the slave node 520, the master node 510 keeps constantly transmitting data "1". In terms of what is shown in FIG. 11, the drive signal G1 is at high level between time points t51 and t52 and between time points t53 and t55, and is at low level between time points t55 and t57.

Here, in the cycle in which the slave node 520 transmits data "1" (i.e., between time points t51 and t53), the drive signal G2 is kept at low level and the transmission transistor 524 is kept off. As a result, the low-level period of the pulse width modulation signal PWM is not extended, and the pulse width WL remains shorter than the logic determination value.

Incidentally, between time points t51 and t52, the transmission transistor 514 in the master node 510 is on and the transmission transistor 524 in the slave node 520 is off. Accordingly, across the communication line 530 passes a minute bus current IBUS (≈0) in the direction from the slave node 520 to the master node 510 (see also FIG. 3 referred to previously).

Meanwhile, when at time point t51 the transmission transistor 514 turns on, a high sink current Ix (the broken-line arrow i1a in FIG. 3) passes through the detector 516 via the terminal resistor 515 with a low resistance value (e.g., 1 kΩ), and thus the sense voltage V11 rises. When the sense voltage V11 becomes higher than the threshold voltage V12, the current detection signal IDET rises to high level.

Subsequently, when at time point t52 the transmission transistor 514 turns on, the sink current Ix mentioned above ceases to pass, and thus the sense voltage V11 starts to fall. When the sense voltage V11 becomes lower than the threshold voltage V12, the current detection signal IDET falls to low level.

Thus, in the cycle in which the slave node 520 transmits data "1" (i.e., between time points t51 and t53), the current detection signal IDET basically does not turn to low level due to the sink current Ix starting to fall before the end of the on-period Ton of the transmission transistor 514.

In this case, the communication circuit 511 determines the off-timing of the transmission transistor 514 regardless of the current detection signal IDET. Specifically, after turning on the transmission transistor 514 at time point t51, at the lapse of the predetermined on-period Ton at time point 52, the communication circuit 511 turns off the transmission transistor 514.

By contrast, in the cycle in which the slave node 520 transmits data "0" (i.e., between time points t53 and t57), the drive signal G2 is raised to high level and the transmission transistor 524 is turned on. Specifically, in terms of what is shown in FIG. 11, after at the time point t53 the drive signal G1 is raised to high level, at time point t54 the drive signal G2 is raised to high level. Then, after at time point t55 the drive signal G1 is dropped to low level, at time point t56 the drive signal G2 is dropped to low level. Thus the low-level period of the pulse width modulation signal PWM is extended and the pulse width WL becomes longer than the logic determination value.

Incidentally, between time points t53 and t54, the transmission transistor 514 in the master node 510 is on and the transmission transistor 524 in the slave node 520 is off Accordingly, across the communication line 530 passes a minute bus current IBUS (≈0) in the direction from the slave node 520 to the master node 510 (see also FIG. 3 referred to previously).

Meanwhile, a high sink current Ix passes through the detector 516 via the terminal resistor 515 with a low resistance value; thus the sense voltage V11 becomes higher than the threshold voltage V12 and the current detection signal IDET rises to high level. This behavior is similar to that between time points t51 and t52.

By contrast, between time points t54 and t55, the transmission transistors 514 and 524 are both on. Accordingly, across the communication line 530 passes a bus current IBUS in the direction from the master node 510 to the slave node 520 (see also FIG. 4 referred to previously).

In this period, the sink current Ix passing through the detector 516 is so much lower as the bus current IBUS is shunted, and thus the sense voltage V11 drops. When the sense voltage V11 becomes lower than the threshold voltage V12, the current detection signal IDET falls to low level.

Thus, in the cycle in which the slave node 520 transmits data "0" (i.e., between time points t53 and t57), a transition occurs from the state where the transmission transistor 514 is on and the transmission transistor 524 is off (i.e., between time points t53 and t54) to the state where the transmission transistors 514 and 524 are both on (between time points t54 and t55). Accordingly, before the end of the on-period Ton of the transmission transistor 514, the sink current Ix starts to decrease and the current detection signal IDET falls to low level.

In this case, the communication circuit 511 determines the off-timing of the transmission transistor 514 based on the fall timing of the current detection signal IDET (i.e. the on-timing of the transmission transistor 524). Specifically, after the fall of the current detection signal IDET to low level at time point 54, at the lapse of a predetermined simultaneously-on period TB (i.e., the time difference after the turning on of the transmission transistor 524 until the turning-off of the transmission transistor 514) at time point 55, the communication circuit 511 turns off the transmission transistor 514.

The off-timing control for the transmission transistor 514 is equivalent to the on-period control (from Ton to Ton') for the transmission transistor 514.

Figure 12:
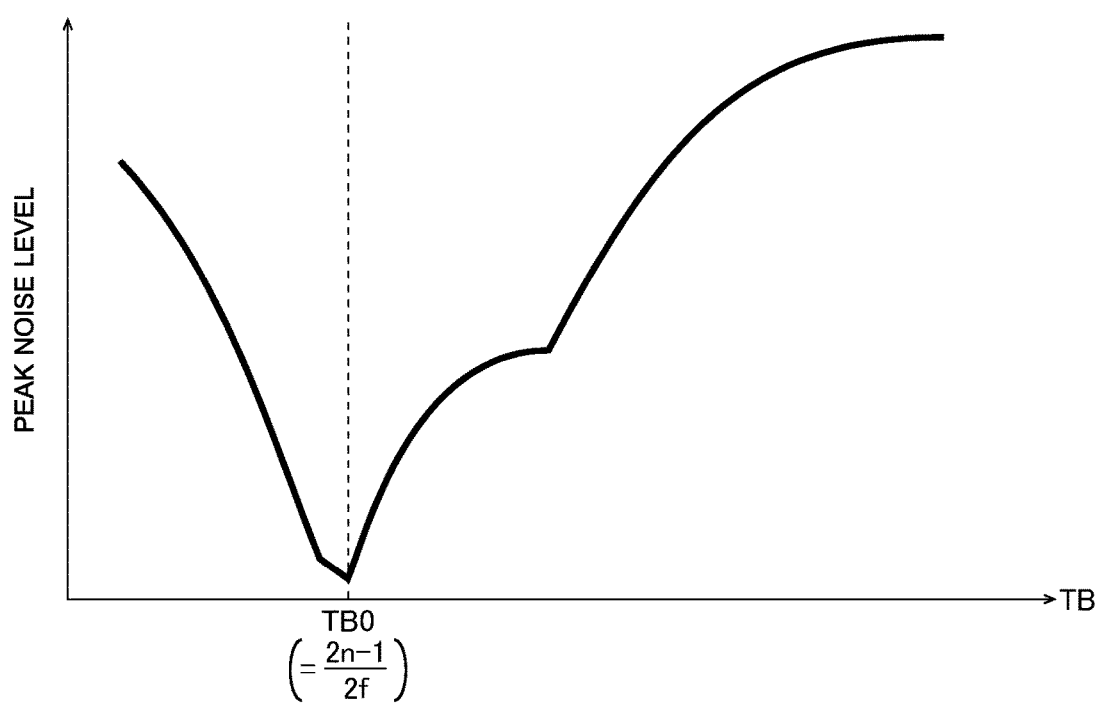
FIG. 12 is a diagram showing a relationship of a simultaneously-on period with peak noise level.

FIG. 12 is a diagram showing the relationship of the simultaneously-on period TB of the transmission transistors 514 and 524 with the peak noise level (the peak level of EMI noise at the frequency f).

As will be understood from FIG. 12, when the simultaneously-on period TB equals a predetermined length TB0 (=(2n−1)/2f), the peak noise level at the frequency f is at its minimum.

The noise suppression effect mentioned above results from, in a certain frequency band (frequency f), the current spectrum components of the bus current IBUS occurring at time point t54 cancel those occurring at time point 55.

Accordingly, in the communication circuit 511, by determining the off-timing of the transmission transistor 514 such that the above-mentioned simultaneously-on period TB fulfills TB=(2n−1)/2f, it is possible to suppress the EMI noise at the frequency f.

For example, by determining the off-timing (hence the on-period) of the transmission transistor 514 so as to suppress the EMI noise in the smart-entry frequency band (f=106 to 160 kHz), it is possible to prevent the communication system 500 from affecting the locking and unlocking with smart keys.

What is particular about the communication system 500 of this embodiment is that, unlike conventional measures against EMI (e.g., Patent Document 1), a measure against EMI is complete in the master node 510 and no counter-EMI circuit needs to be provided in any of the slave nodes 520A to 520C. Thus it is possible to achieve space saving and cost reduction in the communication system 500 from the perspective of the entire communication system 500.

Moreover, with the off-timing control described above, even if a manufacturing-associated variation or the like shortens the high-level period of the drive signal G1 (hence the pulse width WL of the pulse width modulation signal PWM), it is possible to secure a sufficient simultaneously-on period TB of the transmission transistors 514 and 524. Thus it is possible not only to suppress EMI noise as described above but also to suppress glitches in the bus voltage VBUS (hence to improve communication stability).

It is preferable that the off-timing (on-period) of the transmission transistor 514 be set every switching period T.

MODIFIED EXAMPLE

Figure 13:
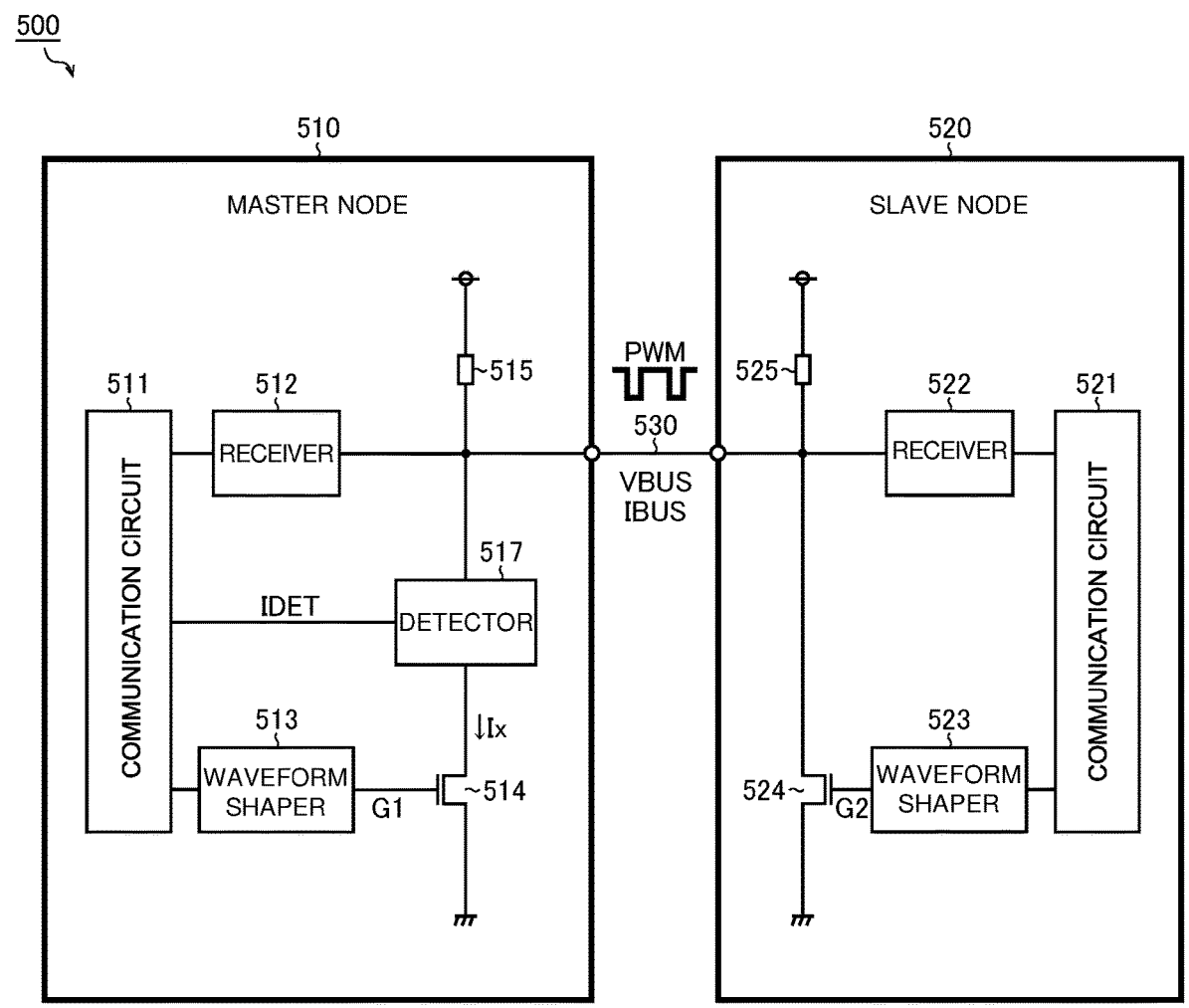
FIG. 13 is a diagram showing one modified example of a master node.

FIG. 13 is a diagram showing one modified example of the master node 510. The master node 100 of this modified example includes, in place of the detector 516 (FIG. 9) described previously, a detector 517.

The detector 517 is connected in the current path via the transmission transistor 514 (in FIG. 13, between the communication line 530 and the drain of the transmission transistor 514). The detector 517 detects a variation in current (i.e., a drop in the sink current Ix passing through the transmission transistor 514) during the on-period of the transmission transistor 514, and feeds the detection result as the current detection signal IDET to the transmission transistor 514.

Figure 14:
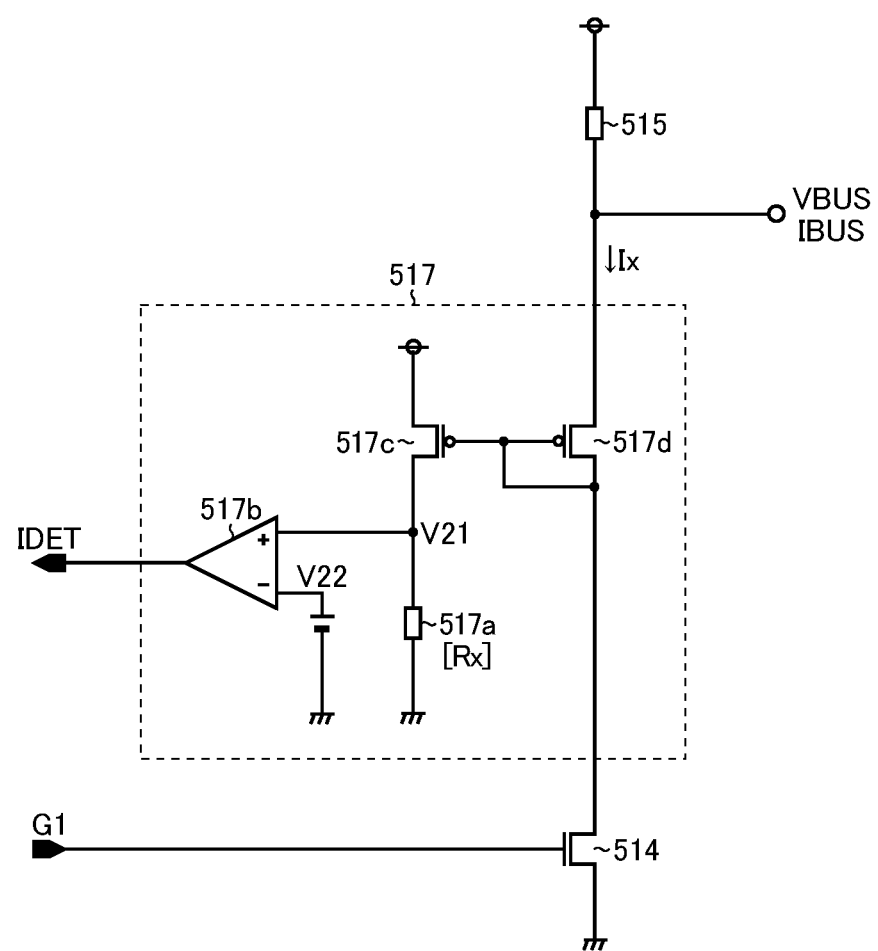
FIG. 14 is a diagram showing one configuration example of a detector in the modified example.

FIG. 14 is a diagram showing one configuration example of the detector 517 in the modified example. The detector 517 of this configuration example includes a sense resistor 517a, a comparator 517b, and PMOSFETs 517c and 517d.

The source of the PMOSFET 517c is connected to the supply power terminal. The source of the PMOSFET 517d is connected to the communication line 530. The respective gates of the PMOSFETs 517c and 517d are both connected to the drain of the PMOSFET 517d. The drain of the PMOSFET 517d is connected to the drain of the transmission transistor 514. So connected, the PMOSFETs 517c and 517d function as a current mirror that mirrors the sink current Ix passing through the drain of the PMOSFET 517d and outputs it from the drain of the PMOSFET 517c. The mirror ratio of the current mirror may be one, or may be other than one.

The sense resistor 517a (with a resistance value Rx) is connected between the drain of the PMOSFET 517c and the ground terminal. The sense resistor 517a acts as a current-voltage conversion element that converts the sink current Ix passing during the on-period of the transmission transistor 514 into a sense voltage V21 (=Ix×Rx).

The comparator 517b compares the sense voltage V21, which is fed to the non-inverting terminal (+) of the comparator 517b, with a predetermined threshold voltage V22, which is fed to the inverting input terminal (−) of the comparator 517b, and thereby generates the current detection signal IDET. The comparator 517b then feeds the current detection signal IDET to the communication circuit 511. The current detection signal IDET is at high level when V21>V22, and is at low level when V21<V22.

In this way, the detector 517 for detecting the sink current Ix may be provided on the upstream side of the transmission transistor 514.

It is here repeated that, as shown in FIGS. 3 to 6 referred to previously, an abrupt variation in the bus current IBUS during data transmission by the slave node 220 causes large EMI noise (see the broken-line frame in FIG. 6). The first embodiment described above presents a scheme for suppressing EMI noise in the master node 210. On the other hand, as a scheme for suppressing EMI noise in the slave node 220, it may be possible to lower the slew rate used when raising the drive signal G2 to high level and thereby limit the bus current IBUS passing when the transmission transistor N2 turns on so as to obtain a gentle current slope.

However, if the bus current IBUS that passes when the transmission transistor N2 turns on is limited unconditionally, a glitch may occur in the bus voltage VBUS, destabilizing (or making impossible) the bidirectional communication between the master node 210 and the slave node 220.

<Glitches>

Figure 15:
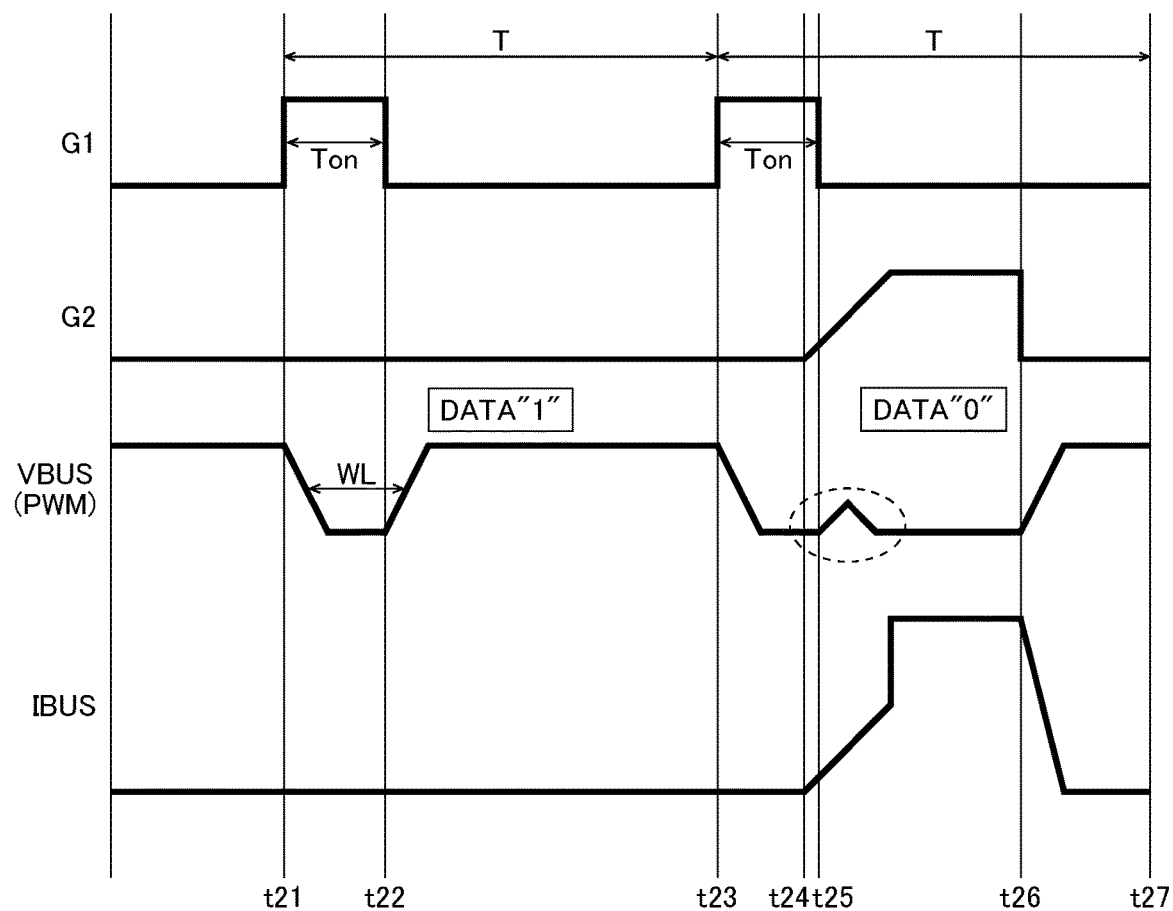
FIG. 15 is a diagram showing how a glitch occurs in a bus voltage when a bus current is limited.

FIG. 15 is a timing chart showing how a glitch occurs in the bus voltage VBUS when the bus current IBUS is limited. Like FIG. 6, FIG. 15 depicts, from the top down, the drive signals G1 and G2, the bus voltage VBUS (i.e., pulse width modulation signal PWM), and the bus current IBUS.

As mentioned previously, during the data transmission period of the slave node 220, the master node 210 keeps constantly transmitting data "1". In terms of what is shown in FIG. 15, the drive signal G1 is at high level between time points t21 and t22 and between time points t23 and t25, and is at low level between time points t22 and t23 and between time points t25 and t27.

It should however be noted that, in FIG. 15, as compared with FIG. 6 referred to previously, the high-level period of the drive signal G1 (hence the pulse width WL of the pulse width modulation signal PWM) is shorter. Thus the CXPI protocol tolerates a certain degree of variation in the pulse width WL of the pulse width modulation signal PWM.

Here, in the cycle in which the slave node 220 transmits data "1" (i.e., between time points t21 and t23), the drive signal G2 is kept at low level and the transmission transistor N2 is kept off. As a result, the low-level period of the pulse width modulation signal PWM is not extended, and the pulse width WL remains shorter than the logic determination value.

Between time points t21 and t22, the transmission transistor N1 in the master node 210 is on and the transmission transistor N2 in the slave node 220 is off. Accordingly, across the communication line 230 passes a minute bus current IBUS (≈0) in the direction from the slave node 220 to the master node 210 (see also FIG. 3 referred to previously).

Thus, in the cycle in which the slave node 220 transmits data "1", even if the pulse width WL happens to be shorter, so long as it falls within the tolerated range, no particular problem arises.

By contrast, in the cycle in which the slave node 220 transmits data "0" (i.e., between time points t23 and t27), the drive signal G2 is raised to high level and the transmission transistor N2 is turned on. Specifically, in terms of what is shown in FIG. 15, after at the time point t23 the drive signal G1 is raised to high level, at time point t24 the drive signal G2 is raised to high level. Then, after at time point t25 the drive signal G1 is dropped to low level, at time point t26 the drive signal G2 is dropped to low level.

Here, as shown in FIG. 15, by lowering the slew rate used when the drive signal G2 is raised to high level and thereby limiting the bus current IBUS passing when the transmission transistor N2 turns on, it is possible give the bus current IBUS a gentle current slope, and it is thus possible to suppress EMI noise.

In the example in FIG. 15, however, the pulse width WL of the pulse width modulation signal PWM is so short that, in the middle of the drive signal G1 being raised to high level, the drive signal G1 is dropped to low level. This may result in a glitch (see the broken-line frame in the diagram) appearing in the bus voltage VBUS, destabilizing (or making impossible) the bidirectional communication between the master node 210 and the slave node 220.

To follow is a presentation of a novel embodiment that provides a solution to the above-mentioned inconvenience.

<Communication System (Second Embodiment)>

Figure 16:
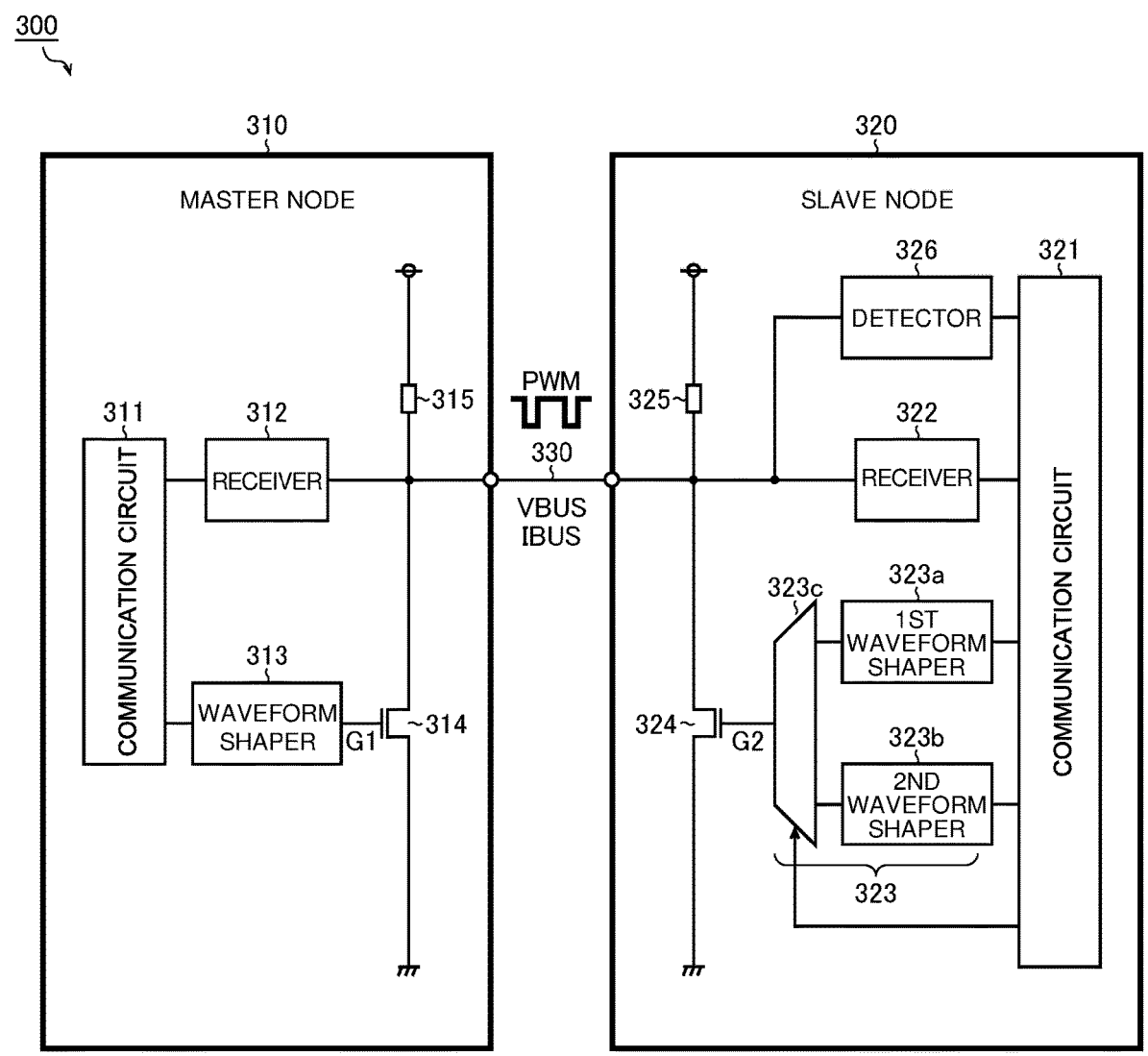
FIG. 16 is a diagram showing a communication system according to a second, novel, embodiment.

FIG. 16 is a diagram showing a communication system according to a second, novel, embodiment. Like the communication system 100 (FIG. 1) and the communication system 200 (FIGS. 3 to 5) described previously, the communication system 300 of this configuration example complies with the CXPI protocol, and includes a master node 310, a slave node 320, and a communication line 330.

The master node 310 includes a communication circuit 311, a receiver 312, a waveform shaper 313, a transmission transistor 314 (e.g., NMOSFET), and a terminal resistor 315.

The communication circuit 311 is connected to both the receiver 312 and the waveform shaper 313, and controls communication in compliance with the CXPI protocol. Specifically, the communication circuit 311 accepts the output of the receiver 312 and thereby receives the data transmitted from the slave node 320. The communication circuit 311 also feeds the waveform shaper 313 with a signal having data superposed on a communication clock, and thereby transmits the data to the slave node 320.

The receiver 312 is connected between the communication circuit 311 and the communication line 330. The receiver 312 detects the pulse width WL of the bus voltage VBUS (i.e., pulse width modulation signal PWM) appearing on the communication line 330, and feeds the detection result to the communication circuit 311. Suitably usable as the receiver 312 is, for example, a comparator that compares the bus voltage VBUS with a predetermined logic determination value.

The waveform shaper 313 is connected between the communication circuit 311 and the transmission transistor 314. The waveform shaper 313 performs wave-shaping on the signal fed from the communication circuit 311 and thereby generates the drive signal G1.

The drain of the transmission transistor 314 is connected to the communication line 330. The source of the transmission transistor 314 is connected to the ground terminal. The gate of the transmission transistor 314 is connected to an application terminal for the drive signal G1 (i.e., the output terminal of the waveform shaper 313). The transmission transistor 314 is on when the drive signal G1 is at high level, and is off when the drive signal G1 is at low level.

The terminal resistor 315 is connected between the supply power terminal and the communication line 330, and together with the transmission transistor 314 constitutes the open-drain output stage of the master node 310.

On the other hand, the slave node 320 includes a communication circuit 321, a receiver 322, a waveform shaper 323, a transmission transistor 324, and a detector 326.

The communication circuit 321 is connected to each of the receiver 322, the waveform shaper 323, and the detector 326, and controls communication in compliance with the CXPI protocol. Specifically, the communication circuit 321 accepts the output of the receiver 322 and thereby receives the data transmitted from the master node 310. The communication circuit 321 also feeds the waveform shaper 323 with a signal having data superposed on a communication clock, and thereby transmits the data to the master node 310.

The communication circuit 321 further has the function of controlling the waveform shaper 323 so as to switch, in accordance with the output of the detector 326, the slew rate used when the drive signal G2 is raised to high level (this will be described in detail later).

The receiver 322 is connected between the communication circuit 321 and the communication line 330. The receiver 322 detects the pulse width WL of the bus voltage VBUS (i.e., pulse width modulation signal PWM) appearing on the communication line 330, and feeds the detection result to the communication circuit 321. Suitably usable as the receiver 322 is, for example, a comparator that compares the bus voltage VBUS with a predetermined logic determination value.

The waveform shaper 323 is connected between the communication circuit 321 and the transmission transistor 324. The waveform shaper 323 performs wave-shaping on the signal fed from the communication circuit 321 and thereby generates the drive signal G2.

In particular, the waveform shaper 323 provided in the slave node 320 includes a first waveform shaper 323a, a second waveform shaper 323b, and a selector 323c, and has the function of switching, in accordance with the output of the detector 326 (specifically, a slew rate control signal generated by the communication circuit 321 in accordance with the output of the detector 326), the slew rate used when the drive signal G2 is raised to high level.

The first waveform shaper 323a, when turning on the transmission transistor 324, raises the drive signal G2 to high level at a first slew rate.

The second waveform shaper 323b, when turning on the transmission transistor 324, raises the drive signal G2 to high level at a second slew rate higher than the first slew rate.

The selector 323c is connected between, at one side, the first and second waveform shapers 323a and 323b and, at the other side, the transmission transistor 324, and enables one of the first and second waveform shapers 323a and 323b in accordance with the output of the detector 326 (specifically, the slew rate control signal generated by the communication circuit 321 in accordance with the output of the detector 326).

The drain of the transmission transistor 324 is connected to the communication line 330. The source of the transmission transistor 324 is connected to the ground terminal. The gate of the transmission transistor 324 is connected to an application terminal for the drive signal G2 (i.e., the output terminal of the waveform shaper 323). The transmission transistor 324 is on when the drive signal G2 is at high level, and is off when the drive signal G2 is at low level.

The terminal resistor 325 is connected between the supply power terminal and the communication line 330, and together with the transmission transistor 324 constitutes the open-drain output stage of the master node 320.

The terminal resistor 315 in the master node 310 (which resistor corresponds to the composite resistance of the terminal resistors R1 and Rx in FIGS. 3 to 5) is given a lower resistance value than the terminal resistor 325 in the slave node 320 (which resistor corresponds to the terminal resistor R2 in FIGS. 3 to 5).

The detector 326 monitors the pulse width WL observed when only the master node 310 is keeping the pulse width modulation signal PWM at the dominant level (i.e., low level), and feeds the monitoring result to the communication circuit 321. Specifically, the detector 326 compares the just-mentioned pulse width WL with a predetermined threshold value TH, and feeds the comparison result to the communication circuit 321.

For example, the detector 326 can compare the pulse width WL with the threshold value TH every cycle, or regularly at predetermined time intervals.

For another example, the detector 326 can hold the minimum value of the pulse width WL while updating it as it is detected periodically, and compare the held value with the threshold value TH.

As mentioned previously, the communication circuit 321 controls the waveform shaper 323 so as to switch the slew rate used when the drive signal G2 is raised to high level in accordance with the output of the detector 326 (the result of checking whether the pulse width WL is greater than the threshold value TH).

Now, the transmission operation of the slave node 320 will be described in detail, for each of two conditions (WL>TH and WL<TH).

<Slave Transmission Operation>

Figure 17:
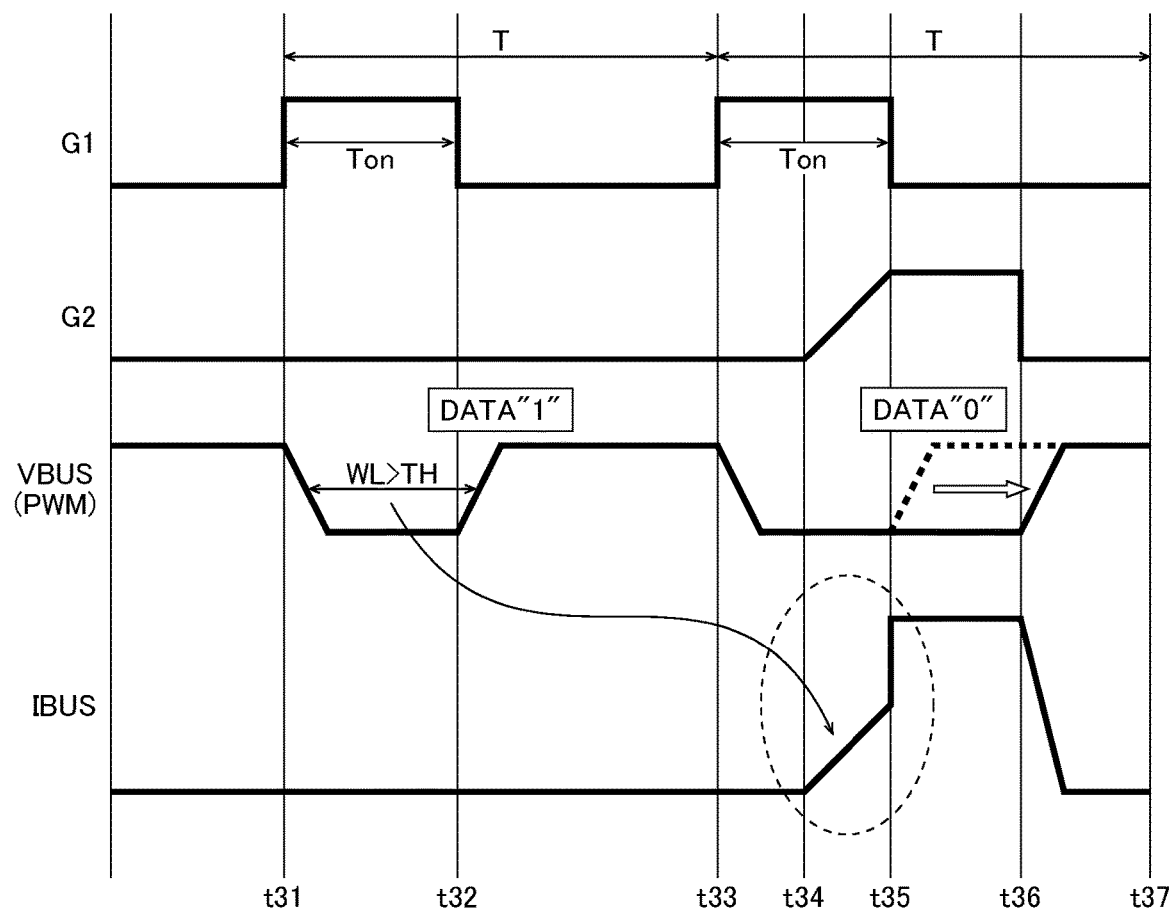
FIG. 17 is a diagram showing first transmission operation (WL>TH) of a slave node.

FIG. 17 is a timing chart showing first transmission operation (when WL>TH) of the slave node 320, and depicts, from the top down, the drive signals G1 and G2, the bus voltage VBUS (i.e., pulse width modulation signal PWM), and the bus current IBUS.

During the data transmission period of the slave node 320, the master node 310 keeps constantly transmitting data "1". In terms of what is shown in FIG. 17, the drive signal G1 is at high level between time points t31 and t32 and between time points t33 and t35, and is at low level between time points t32 and t33 and between time points t35 and t37.

Here, in the cycle in which the slave node 320 transmits data "1" (i.e., between time points t31 and t33), the drive signal G2 is kept at low level and the transmission transistor 324 is kept off. As a result, the low-level period of the pulse width modulation signal PWM is not extended, and the pulse width WL remains shorter than the logic determination value.

Incidentally, between time points t31 and t32, the transmission transistor 314 in the master node 310 is on and the transmission transistor 324 in the slave node 320 is off. Accordingly, across the communication line 330 passes a minute bus current IBUS (≈0) in the direction from the slave node 320 to the master node 310 (see also FIG. 3 referred to previously).

By contrast, in the cycle in which the slave node 320 transmits data "0" (i.e., between time points t33 and t37), the drive signal G2 is raised to high level and the transmission transistor 524 is turned on. Specifically, in terms of what is shown in FIG. 17, after at the time point t33 the drive signal G1 is raised to high level, at time point t34 the drive signal G2 is raised to high level. Then, after at time point t35 the drive signal G1 is dropped to low level, at time point t36 the drive signal G2 is dropped to low level. Thus the low-level period of the pulse width modulation signal PWM is extended and the pulse width WL becomes longer than the logic determination value.

Incidentally, between time points t33 and t34, the transmission transistor 314 in the master node 310 is on and the transmission transistor 324 in the slave node 320 is off. Accordingly, across the communication line 330 passes a minute bus current IBUS (≈0) in the direction from the slave node 320 to the master node 310 (see also FIG. 3 referred to previously). This behavior is similar to that between the preceding time points t31 and t32.

By contrast, between time points t34 and t35, the transmission transistors 314 and 324 are both on. Accordingly, across the communication line 330 passes a bus current IBUS in the direction from the master node 310 to the slave node 320 (see also FIG. 4 referred to previously).

Here, at the on-transition of the transmission transistor 324 at time point t34, if the pulse width WL detected prior to the on-transition is greater than the threshold value TH, the waveform shaper 323 controls the drive signal G2 so as to limit the bus current IBUS passing across the communication line 330.

Specifically, at the on-transition of the transmission transistor 324 at time point t34, if the bus current IBUS is to be limited, the waveform shaper 323 enables the first waveform shaper 323a so that the drive signal G2 will turn to high level gently at the first slew rate. In this way it is possible to give the bus current IBUS a gentle current slope, and thereby to suppress EMI noise.

Moreover, if the pulse width WL observed when only the master node 310 is keeping the pulse width modulation signal PWM at the dominant level (i.e., low level) is greater than the threshold value TH, limiting the bus current IBUS does not hamper establishment of communication.

Figure 18:
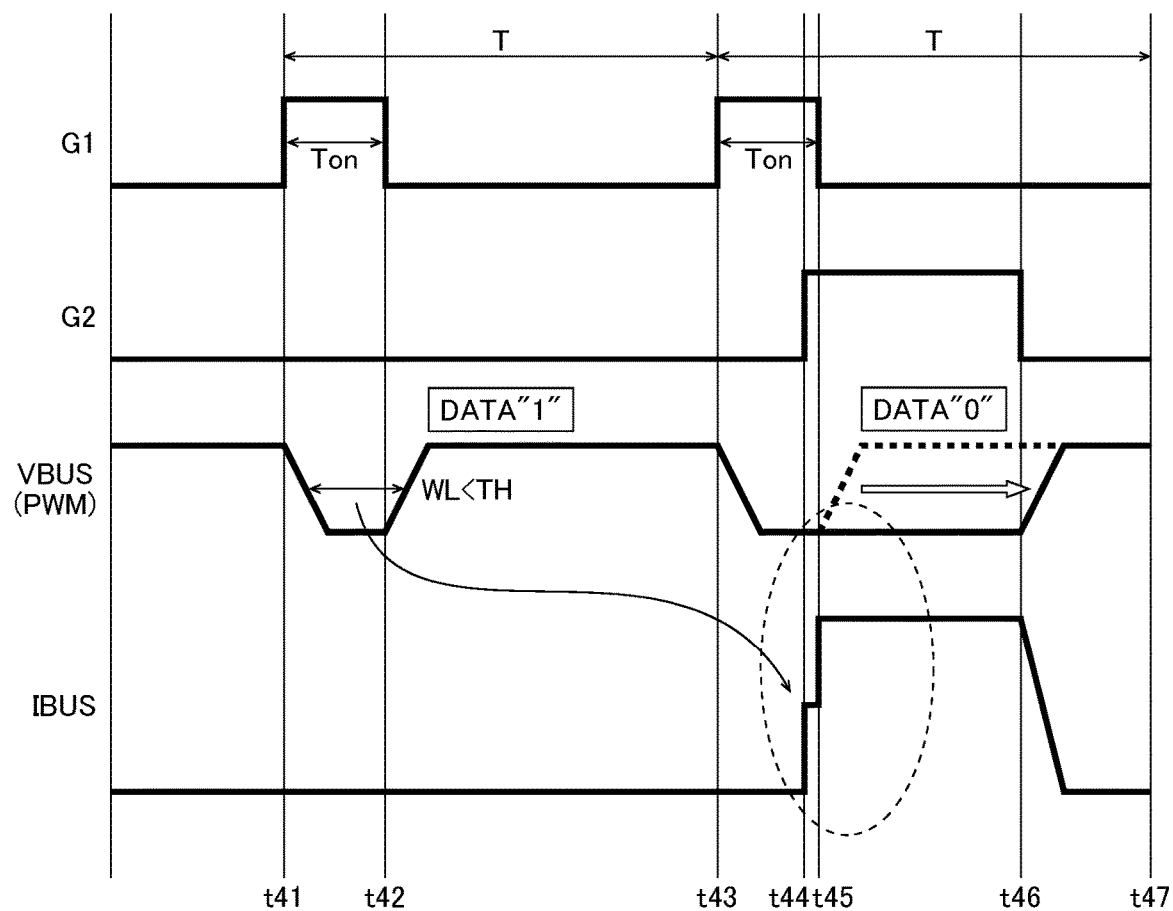
FIG. 18 is a diagram showing second transmission operation (WL<TH) of a slave node.

FIG. 18 is a timing chart showing second transmission operation (WL<TH) of the slave node 320. Like FIG. 17 referred to previously, FIG. 18 depicts, from the top down, the drive signals G1 and G2, the bus voltage VBUS (i.e., pulse width modulation signal PWM), and the bus current IBUS.

As mentioned above, during the data transmission period of the slave node 320, the master node 310 keeps constantly transmitting data "1". In terms of what is shown in FIG. 18, the drive signal G1 is at high level between time points t41 and t42 and between time points t43 and t45, and is at low level between time points t42 and t43 and between time points t45 and t47.

In FIG. 18, however, as compared with FIG. 17 referred to previously, the high-level period of the drive signal G1 (hence the pulse width WL of the pulse width modulation signal PWM) is shorter. Thus the CXPI protocol tolerates a certain degree of variation in the pulse width WL of the pulse width modulation signal PWM. This is similar to what has been described with reference to FIG. 15 referred to previously.

Here, in the cycle in which the slave node 320 transmits data "1" (i.e., between time points t41 and t43), the drive signal G2 is kept at low level and the transmission transistor 324 is kept off. As a result, the low-level period of the pulse width modulation signal PWM is not extended, and the pulse width WL remains shorter than the logic determination value.

Between time points t41 and t42, the transmission transistor 314 in the master node 310 is on and the transmission transistor 324 in the slave node 320 is off. Accordingly, across the communication line 330 passes a minute bus current IBUS (≈0) in the direction from the slave node 320 to the master node 310 (see also FIG. 3 referred to previously).

Thus, in the cycle in which the slave node 320 transmits data "1", even if the pulse width WL happens to be shorter, so long as it falls within the tolerated range, no particular problem arises.

By contrast, in the cycle in which the slave node 320 transmits data "0" (i.e., between time points t43 and t47), the drive signal G2 is raised to high level and the transmission transistor 324 is turned on. Specifically, in terms of what is shown in FIG. 18, after at the time point t43 the drive signal G1 is raised to high level, at time point t44 the drive signal G2 is raised to high level. Then, after at time point t45 the drive signal G1 is dropped to low level, at time point t46 the drive signal G2 is dropped to low level.

Here, at the on-transition of the transmission transistor 324 at time point t44, if the pulse width WL detected prior to the on-transition is smaller than the threshold value TH, the waveform shaper 323 drives the drive signal G2 so as not to limit the bus current IBUS passing across the communication line 330.

Specifically, at the on-transition of the transmission transistor 324 at time point t44, if the bus current IBUS is not to be limited, the waveform shaper 323 enables the second waveform shaper 323b so that the drive signal G2 will turn to high level quickly at the second slew rate higher than the first slew rate. In this way it is possible to give the bus current IBUS a steep current slope, and thereby to give priority to establishment of communication over suppression of EMI noise.

<Waveform Shaper>

Figure 19:
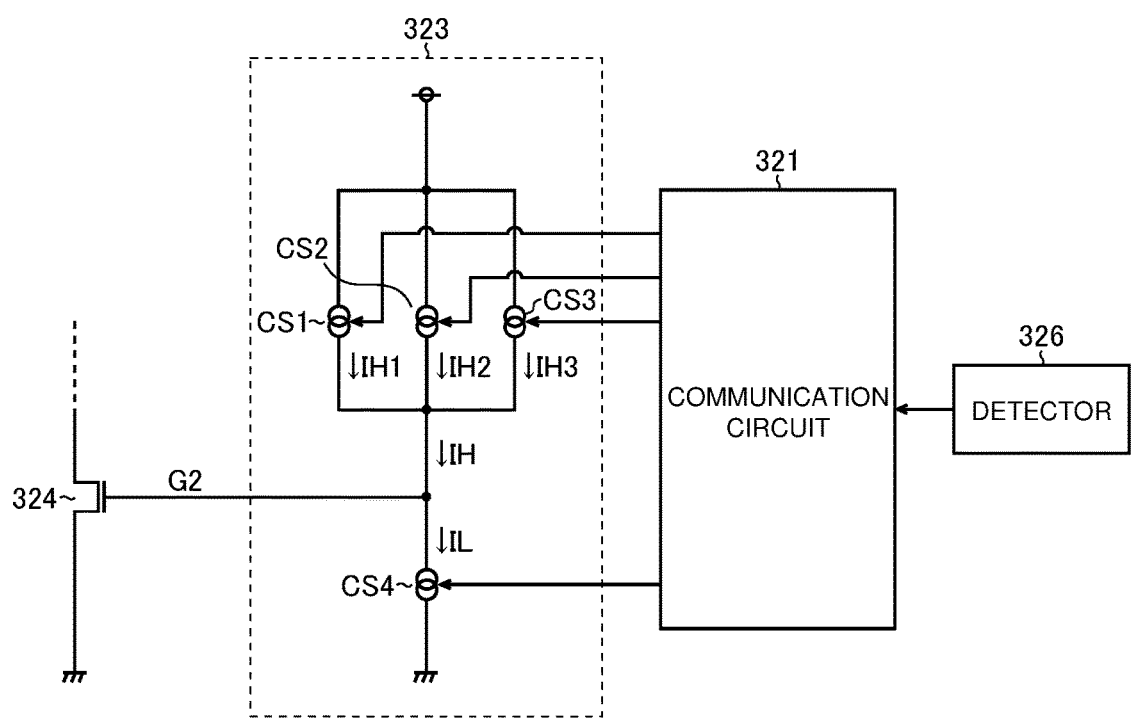
FIG. 19 is a diagram showing one modified example of a waveform shaper.

FIG. 19 is a diagram showing one modified example of the waveform shaper 323. The waveform shaper 323 of this modified example includes, instead of the first and second waveform shapers 323a and 323b and the selector 323c described previously, current sources CS1 to CS4.

The current sources CS1 to CS3 are connected in parallel between the supply power terminal and the gate of the transmission transistor 324 (i.e., the application terminal for the drive signal G2), and generate on-currents IH1 and IH3, respectively, for switching the drive signal G2 to high level (i.e., the logic level corresponding to the on-period). The on-currents IH1 and IH3 may have an equal current value, or may have different current values.

The current source CS4 is connected between the gate of the transmission transistor 324 (i.e., the application terminal for the drive signal G2) and the ground terminal, and generates an off-current IL for turning the drive signal G2 to low level (the logic level corresponding to the off-period).

When turning the drive signal G2 to high level, the communication circuit 321 turns at least one of the current sources CS1 to CS3 on and keeps the current source CS4 off. By contrast, when turning the drive signal G2 to low level, the communication circuit 321 keeps the current sources CS1 to CS3 all off and turns the current source CS4 on.

The communication circuit 321 also has the function of, when turning the drive signal G2 from low level to high level, turns the current sources CS1 to CS3 (hence the on-currents IH1 and IH3) on and off individually in accordance with the output of the detector 326, in other words, the function of controlling the magnitude of an on-current IH that is fed into the gate capacitance of the transmission transistor 324.

For example, with the current source CS1 on and the current sources CS2 and CS3 off, IH=IH1. For another example, with the current sources CS1 and CS2 on and the current source CS3 off, IH=IH1+IH2. For yet another example, with the current sources CS1 to CS3 all on, IH=IH1+IH2+IH3.

The lower the on-current IH mentioned above, the more gently the drive signal G2 rises, and thus the more the bus current IBUS passing during the on-transition of the transmission transistor 324 is limited. Reversely, the higher the on-current IH, the more steeply the drive signal G2 rises, and the less the bus current IBUS is limited.

Accordingly, for example, if the pulse width WL of the pulse width modulation signal PWM is greater than the threshold value TH, not all of the current sources CS1 to CS3 are turned on, so as to keep the on-current IH low; it is thus possible to limit the bus current IBUS and thereby suppress EMI noise.

By contrast, when the pulse width WL of the pulse width modulation signal PWM is smaller than the threshold value TH, all the current sources CS1 to CS3 are turned on, so as to feed a higher on-current IH; it is thus possible to keep the bus current IBUS unlimited and thereby improve communication stability.

<Application to Vehicles>

Figure 20:
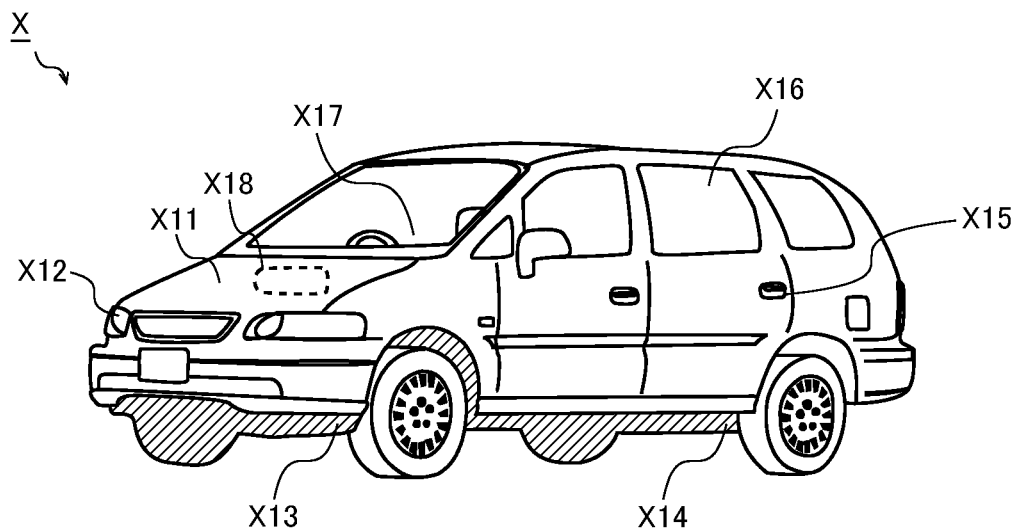
FIG. 20 is a diagram showing an exterior appearance of a vehicle.

FIG. 20 is a diagram showing the exterior appearance of a vehicle. The vehicle X of this configuration example incorporates various electronic appliances X11 to X18 that operate by being supplied with electric power from a battery (not shown). For the sake of convenience, FIG. 20 may not show the electronic appliances X11 to X18 at the places where they are actually arranged.

The electronic appliance X11 is an engine control unit that performs control with respect to an engine (injection control, electronic throttle control, idling control, oxygen sensor heater control, automatic cruise control, etc.).

The electronic appliance X12 is a lamp control unit that controls the lighting and extinguishing of HIDs (high-intensity discharged lamps), DRLs (daytime running lamps), and the like.

The electronic appliance X13 is a transmission control unit that performs control with respect to a transmission.

The electronic appliance X14 is a movement control unit that performs control with respect to the movement of the vehicle X (ABS [anti-lock brake system] control, EPS [electric power steering] control, electronic suspension control, and the like).

The electronic appliance X15 is a security control unit that drives and controls door locks, burglar alarms, and the like.

The electronic appliance X16 comprises electronic appliances incorporated in the vehicle X as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle X optionally as user-fitted equipment, such as A/V (audio/visual) equipment, a car navigation system, and an ETC (electronic toll control system).

The electronic appliance X18 comprises electronic appliances provided with high-withstand-voltage motors, such as a vehicle-mounted blower, an oil pump, a water pump, and a battery cooling fan.

Any of the communication systems described above and any of the nodes in them, i.e., the communication system 500 (hence the master node 510 and the slave node 520) and the communication system 300 (hence master node 310 and the slave node 320), can be incorporated in any of the electronic appliances X11 to X18.

<Examples of Application>

While the embodiments described above deal with, as an example, communication systems that comply with the CXPI protocol, this is not meant to limit the target of application of the present invention. The present invention finds applications in communication systems in general that operate by a principle similar to what is described herein, that is, such communication systems in general as use a pulse width modulation signal as transmission code among a plurality of nodes and are configured to arbitrate collision between signals transmitted from different nodes by letting the node transmitting the dominant level longer prevail.

<Other Modifications>

The various technical features disclosed herein may be implemented in any manners other than in the embodiments described above, and allow for many modifications without departure from the spirit of their technical ingenuity. That is, the embodiments described above should be understood to be in every aspect illustrative and not restrictive, and the technical scope of the present invention is defined not by the description of the embodiments given above but by the appended claims and encompasses any modifications within a scope and sense equivalent to those claims.

INDUSTRIAL APPLICABILITY

The invention described herein finds applications in, for example, vehicle onboard communication systems (in particular, those which comply with the CXPI protocol).

REFERENCE SIGNS LIST

10 emission test system
11 EUT
12 current probe
13 harness
14 load
15 LISN
16 power supply
100, 200, 300, 400, 500 communication system
110, 210, 310, 410, 510 master node
111, 211 CXPI transceiver
112 microprocessor
113 oscillator
120A, 120B, 220, 320, 420A to 420C, 520, 520A the 520C slave node
121A, 121B, 221 CXPI transceiver
122 microprocessor
130, 230, 330, 430, 530 communication line
311, 321 communication circuit
312, 322 receiver
313, 323 waveform shaper
323*a* first waveform shaper
323*b* second waveform shaper
323*c* selector
314, 324 transmission transistor
315, 325 resistor
511, 521 communication circuit
512, 522 receiver
513, 523 waveform shaper
514, 524 transmission transistor
515, 525 terminal resistor
516, 517 detector
516*a*, 517*a* sense resistor
516*b*, 517*b* comparator
517*c*, 517*d* PMOSFET
C1, C2 capacitor
CS1 to CS4 current source
L1, L2 inductor
N1, N2 transmission transistor
R1, R2, Rx terminal resistor
X vehicle
X11 to X18 electronic appliance
ZD1*a*, ZD1*b*, ZD2*a*, ZD2*b* Zener diode

The invention claimed is:

1. A communication device to be used as a master node in a communication system configured to use a pulse width modulation signal as transmission code among a plurality of nodes connected to a communication line, the communication device comprising:

a transmission transistor configured to be connected to the communication line;
a detector configured to detect a variation in current during an on-period of the transmission transistor; and
a communication circuit configured to determine off-timing of the transmission transistor based on timing of occurrence of the variation in current, wherein
the timing of occurrence of the variation in current corresponds to on-timing of a second transmission transistor provided in a slave node, and
the communication circuit is configured to determine the off-timing of the transmission transistor such that a simultaneously-on period TB of the transmission transistor and the second transmission transistor fulfills TB=(2n−1)/2f, where f is a frequency of electromagnetic interference (EMI) noise and n is a natural number.

2. The communication device according to claim 1, wherein the detector is provided in a current path via the transmission transistor.

3. The communication device according to claim 1, wherein the detector includes:
a current-voltage conversion element configured to convert a current signal into a voltage signal; and
a comparator configured to compare the voltage signal with a predetermined threshold value.

4. The communication device according to claim 1, further comprising:
a receiver connected to the communication line; and
a waveform shaper configured to control a drive signal for the transmission transistor.

5. A communication system including a master node, a slave node, and a communication line, the communication system using a pulse width modulation signal as transmission code between the master node and the slave node, which are connected to the communication line, wherein
the master node is the communication device according to claim 1.

6. The communication system according to claim 5, wherein a terminal resistor in the master node has a lower resistance value than a terminal resistor in the slave node.

7. The communication system according to claim 6, wherein
the communication system complies with a clock extension peripheral interface (CXPI) protocol.

8. A vehicle comprising the communication system according to claim 5.

9. A communication device to be used as a slave node in a communication system configured to use a pulse width modulation signal as transmission code among a plurality of nodes connected to a communication line, the communication device comprising:
a transmission transistor connected to the communication line;
a detector configured to monitor a pulse width when only a master node is keeping the pulse width modulation signal at a dominant level; and
a waveform shaper configured to control a drive signal for the transmission transistor in accordance with an output of the detector.

10. The communication device according to claim 9, wherein the detector is configured to compare the pulse width with a predetermined threshold value.

11. The communication device according to claim 10, wherein
the waveform shaper is configured such that, at an on-transition of the transmission transistor,
if the pulse width detected prior to the on-transition is greater than the threshold value, the waveform shaper controls the drive signal so as to limit a bus current passing across the communication line and,
if the pulse width is smaller than the threshold value, the waveform shaper controls the drive signal so as not to limit the bus current.

12. The communication device according to claim 11, wherein
the waveform shaper is configured such that, at an on-transition of the transmission transistor,
when limiting the bus current, the waveform shaper turns the drive signal to a logic level corresponding to an on-period at a first slew rate and,
when not limiting the bus current, the waveform shaper turns the drive signal to the logic level corresponding to the on-period at a second slew rate higher than the first slew rate.

13. The communication device according to claim 12, wherein
the waveform shaper includes:
a first waveform shaper configured to turn the drive signal to the logic level corresponding to the on-period at the first slew rate;
a second waveform shaper configured to turn the drive signal to the logic level corresponding to the on-period at the second slew rate; and
a selector configured to enable one of the first and second waveform shapers in accordance with the output of the detector.

14. The communication device according to claim 9, wherein
the waveform shaper includes a current source configured to generate an on-current for turning the drive signal to a logic level corresponding to an on-period, and is configured to control a magnitude of the on-current in accordance with the output of the detector.

15. The communication device according to claim 9, further comprising:
a receiver and a terminal resistor that are connected to the communication line; and
a communication circuit that is connected to the detector, to the waveform shaper, and to the receiver.

16. A communication system including a master node, a slave node, and a communication line, the communication system using a pulse width modulation signal as transmission code between the master node and the slave node, which are connected to the communication line, wherein
the slave node is the communication device according to claim 9.

17. The communication system according to claim 16, wherein
a terminal resistor in the master node has a lower resistance value than a terminal resistor in the slave node.

18. A vehicle comprising the communication system according to claim 16.

* * * * *